US011859915B1

(12) United States Patent
Azar et al.

(10) Patent No.: US 11,859,915 B1
(45) Date of Patent: Jan. 2, 2024

(54) FLUID MOVER ENCLOSURE

(71) Applicant: Advanced Thermal Solutions, Inc., Norwood, MA (US)

(72) Inventors: Kaveh Azar, Quincy, MA (US); Bahman Tavassoli-Hojati, Norton, MA (US)

(73) Assignee: Advanced Thermal Solutions, Inc., Norwood, MA (US)

( * ) Notice: Subject to any disclaimer, the term of this patent is extended or adjusted under 35 U.S.C. 154(b) by 381 days.

(21) Appl. No.: 16/263,782

(22) Filed: Jan. 31, 2019

(51) Int. Cl.
| | |
|---|---|
| *H05K 7/20* | (2006.01) |
| *F28D 21/00* | (2006.01) |
| *H01L 23/467* | (2006.01) |
| *H01S 3/02* | (2006.01) |
| *H01S 3/04* | (2006.01) |

(52) U.S. Cl.
CPC ............ *F28D 21/00* (2013.01); *H01L 23/467* (2013.01); *H05K 7/20145* (2013.01); *F28D 2021/0029* (2013.01); *H01S 3/025* (2013.01); *H01S 3/04* (2013.01)

(58) Field of Classification Search
CPC .............................. H05K 7/20; H05K 7/20172
See application file for complete search history.

(56) References Cited

U.S. PATENT DOCUMENTS

| | | | | |
|---|---|---|---|---|
| 3,799,255 | A | * | 3/1974 | Luderssen ............... F24F 13/22 165/122 |
| D249,790 | S | | 10/1978 | Ainscow |
| D311,427 | S | | 10/1990 | Banerjee |
| 5,158,136 | A | | 10/1992 | Azar |
| 5,288,203 | A | * | 2/1994 | Thomas ................ H01L 23/467 361/697 |
| 5,522,700 | A | * | 6/1996 | Hong ..................... F04D 29/582 165/122 |
| 5,896,917 | A | * | 4/1999 | Lemont .................. H01L 23/38 165/125 |
| 6,043,980 | A | * | 3/2000 | Katsui ................... H01L 23/467 361/679.48 |
| D427,856 | S | | 7/2000 | Sellers |
| 6,196,302 | B1 | | 3/2001 | Chuang |
| 6,239,986 | B1 | | 5/2001 | Otsuka |

(Continued)

OTHER PUBLICATIONS

Aitechnology, "Automotive Electronic Adhesives & Thermal Interface Materials for Power Electronics", Accessed Apr. 7, 2020. https://www.aitechnology.com/products/automtive-adhesives-and-tims/) (Year: 2020).

(Continued)

*Primary Examiner* — Devon Russell
(74) *Attorney, Agent, or Firm* — Lieberman & Brandsdorfer, LLC

(57) ABSTRACT

Embodiments relate to a system and method for dissipating heat from a heat generating component. The system and method an assembly of a fenestrated housing and a plenum and positioning of the assembly relate to the heat generating component. The plenum accommodates a fluid mover relative to the fenestrated housing. The fenestrations function to support multi-directional fluid flow created by the fluid mover and accommodated by the fenestrations, which function as ports to direct fluid with respect to the heat generating component.

19 Claims, 31 Drawing Sheets

(56) References Cited

U.S. PATENT DOCUMENTS

| | | | |
|---|---|---|---|
| 6,269,003 B1 * | 7/2001 | Wen-Chen | H01L 23/467 257/722 |
| 6,305,955 B1 | 10/2001 | Billman | |
| 6,351,394 B1 | 2/2002 | Cunningham | |
| 6,415,853 B1 * | 7/2002 | Tao | H01L 23/4093 361/697 |
| D463,383 S | 9/2002 | Hwang | |
| D478,055 S | 8/2003 | Jing et al. | |
| D479,828 S | 9/2003 | Dugas | |
| D479,829 S | 9/2003 | Dugas | |
| 6,628,512 B2 | 9/2003 | Searby et al. | |
| D482,008 S | 11/2003 | Petronio | |
| D490,382 S | 5/2004 | Dugas | |
| D496,907 S | 10/2004 | Hwang | |
| D512,697 S | 12/2005 | Enns et al. | |
| D520,621 S | 5/2006 | Moser | |
| 7,064,954 B1 * | 6/2006 | Wu | G06F 1/20 174/16.3 |
| 7,113,403 B2 * | 9/2006 | Kuo | H01L 23/467 257/722 |
| 7,117,932 B2 * | 10/2006 | Ku | H01L 23/467 361/697 |
| D531,965 S | 11/2006 | Stathakis | |
| D536,675 S | 2/2007 | Millar et al. | |
| D543,953 S | 6/2007 | Dugas et al. | |
| D553,170 S | 10/2007 | Remsburg et al. | |
| D553,656 S | 10/2007 | Reeves et al. | |
| D605,141 S | 12/2009 | Jones | |
| D624,677 S | 9/2010 | Deguglimo et al. | |
| D650,339 S | 12/2011 | Chang et al. | |
| D659,868 S | 5/2012 | Deguglimo et al. | |
| D662,897 S | 7/2012 | Desalis et al. | |
| D694,703 S | 12/2013 | Faro | |
| D699,690 S | 2/2014 | Hsu et al. | |
| D701,180 S | 3/2014 | Park et al. | |
| D732,613 S | 6/2015 | Davies | |
| D777,266 S | 1/2017 | Davies | |
| D786,668 S | 5/2017 | Cornaglia | |
| D791,711 S | 7/2017 | Holton | |
| D797,049 S | 9/2017 | Keswani et al. | |
| D810,022 S | 2/2018 | Keswani et al. | |
| D812,022 S | 3/2018 | Buchanan | |
| D819,578 S | 6/2018 | Su | |
| D822,625 S | 7/2018 | Tamura et al. | |
| D836,573 S | 12/2018 | Ichino et al. | |
| 10,165,696 B1 * | 12/2018 | Blasingame | H05K 5/0221 |
| D856,944 S | 8/2019 | Azar et al. | |
| D856,945 S | 8/2019 | Azar et al. | |
| 2009/0314465 A1 | 12/2009 | Zheng et al. | |
| 2010/0134978 A1 * | 6/2010 | Lin | H01L 23/467 361/697 |
| 2015/0296662 A1 * | 10/2015 | Azar | H01L 23/467 165/185 |
| 2017/0354060 A1 * | 12/2017 | Pedoeem | H05K 7/20145 |
| 2018/0328394 A1 * | 11/2018 | Uchida | F16F 15/08 |

OTHER PUBLICATIONS

Digi-Key, "Product Index > Connectors, Interconnects > Pluggable Connectors ? Molex 0738470001", Accessed Apr. 7, 2020. (https://www.digikey.ca/product-detail/en/molex/73847-0001/WM1631-ND/416447) (Year: 2020).

List of Advanced Thermal Solutions, Inc. Patents or Applications Treated as Related, Jun. 2020.

\* cited by examiner

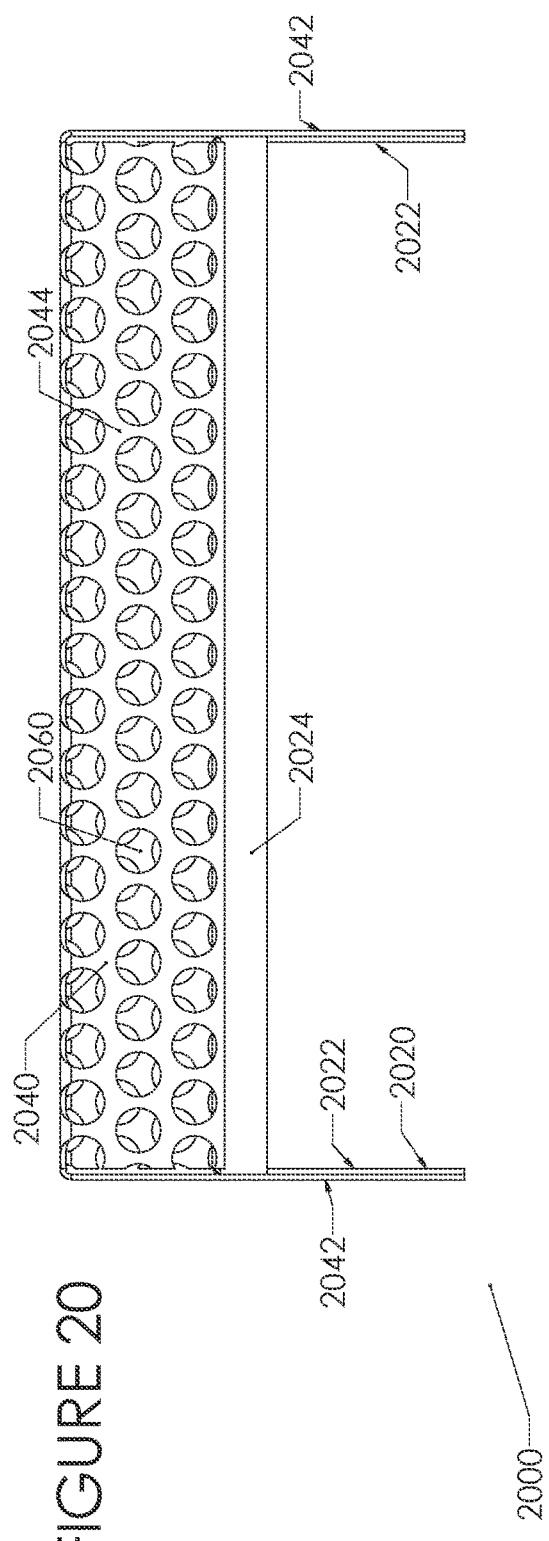
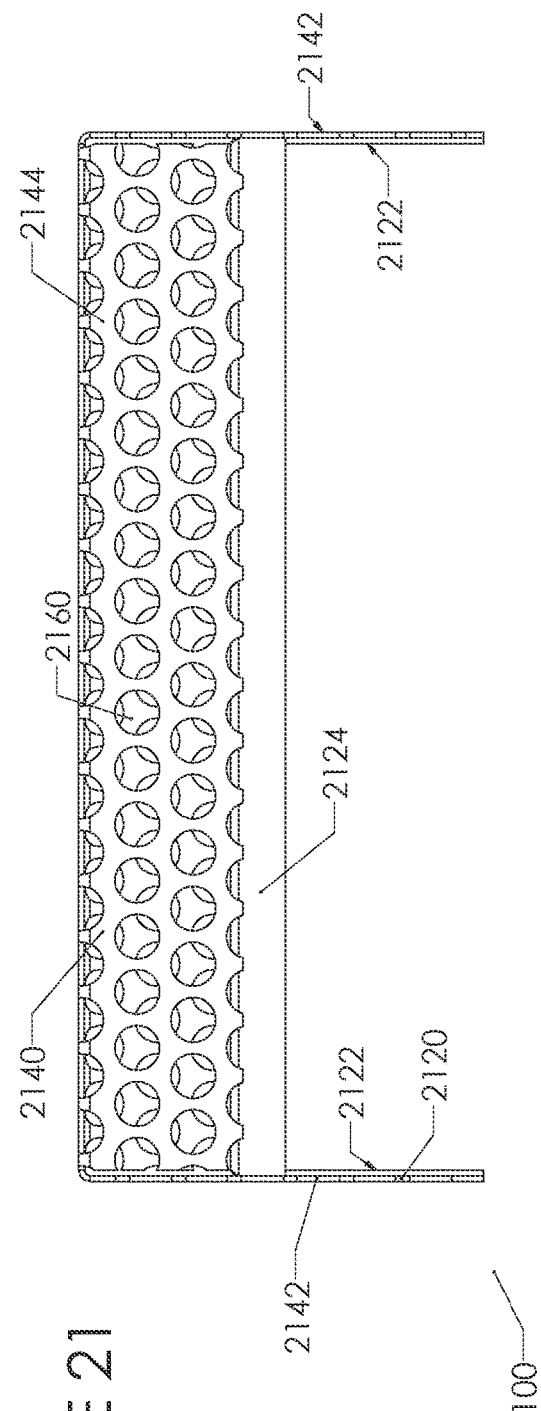

2500

2600

2700

2800

3200

FLUID MOVER ENCLOSURE

BACKGROUND

The present embodiment(s) relate to an assembly to support multi-directional fluid flow. More specifically, the assembly is directed at integration of a plenum as an interface between a secondary medium and a fenestrated housing with the positioning of the plenum and the fenestrations to support the multi-directional fluid flow with respect to the secondary medium.

It is important to dissipate heat produced by electronic devices in order to extend the useful life of these devices. Heat dissipation is particularly important in the case of high-power electronic components, such as microprocessors and lasers, which generate a relatively high amount of heat in a relatively small area. A heat exchanger is an apparatus to transfer thermal energy from one medium to another without direct contact of the mediums. Heat exchangers may be found in applications requiring transfer of thermal energy between two fluids, a fluid and a gas, a fluid and a solid, or a gas and a solid. Due to the varied application of heat exchangers, there are various types, each type having different characteristics of heat transfer.

Conventional heat exchanger devices typically utilize an array of extended surfaces, such as fins, integrally formed on a common base. The array of extended surfaces, also known as a fin array, project into an ambient fluid surrounding the device. The base is placed in intimate contact with the heat-producing device to provide a conduction path to the fin array. Through forced or natural convection, fluid circulation around the fin array acts as the heat transfer medium for cooling the device to an operable temperature.

Designing acceptable heat exchangers to adequately dissipate the heat generated by these heat generating components is challenging. These electronic components are typically used within a system housed in an enclosed cabinet having a fluid mover, e.g. fan, mounted therein. The fan acts to pull cooling fluid across the heat generating electrical components. Given their relative simplicity, traditional extruded plate fin heat exchangers are generally preferred both because of cost and implementation. Traditional plate fin heat exchangers generally offer high surface area relative to their volume. However, the design of the conventional plate fin heat exchanger is often inadequate for dissipating heat generated from high power electronic components.

SUMMARY

An apparatus and method are provided with a fenestrated housing assembly for a heat exchanger to support multi-directional fluid flow with respect to a secondary medium.

In one aspect, the apparatus is provided with an assembly of a plenum and a proximally positioned housing body. The plenum is adapted to be positioned proximal to a secondary medium. The plenum includes an aperture sized to receive a fluid mover, with the fluid mover creating a fluid flow directed with respect to a characteristic of the secondary medium. The housing body is in communication with the plenum and positioned proximal to the secondary medium. The housing body is provided or configured with a plurality of fenestrations to support a multi-directional fluid flow associated with the created fluid flow. The fluid flow functions to dissipate heat with respect to the secondary medium.

In another aspect, a method is provided for dissipating heat from a heat generating component. A plenum is configured with an aperture sized to receive a fluid mover. The plenum is positioned proximal to a secondary medium. A housing body is positioned in communication with the plenum and proximal to the secondary medium. The housing body is configured or provided with a plurality of fenestrations. The fluid mover creates a fluid flow directed with respect to a characteristic of the secondary medium, and the housing body fenestrations support a multi-directional fluid flow associated with the created fluid flow. The housing fenestrations provide a venue for the created fluid flow with respect to the secondary medium, and the fenestrations function as a port with respect to the created fluid flow and a corresponding relationship to the secondary medium. The port may be configured as an egress port to direct fluid flow away from the secondary medium, or as an ingress port to direct fluid flow toward the secondary medium.

These and other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments and not of all embodiments unless otherwise explicitly indicated.

FIG. 20 depicts a front view of the fenestrated housing and proximally positioned plenum of FIG. 13.

FIG. 21 depicts a rear view of the fenestrated housing and proximally positioned plenum of FIG. 13.

DETAILED DESCRIPTION

It will be readily understood that the components of the present embodiments, as generally described and illustrated in the Figures herein, may be arranged and designed in a wide variety of different configurations. Thus, the following detailed description of the embodiments of the apparatus, system, and method, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Figure 1:
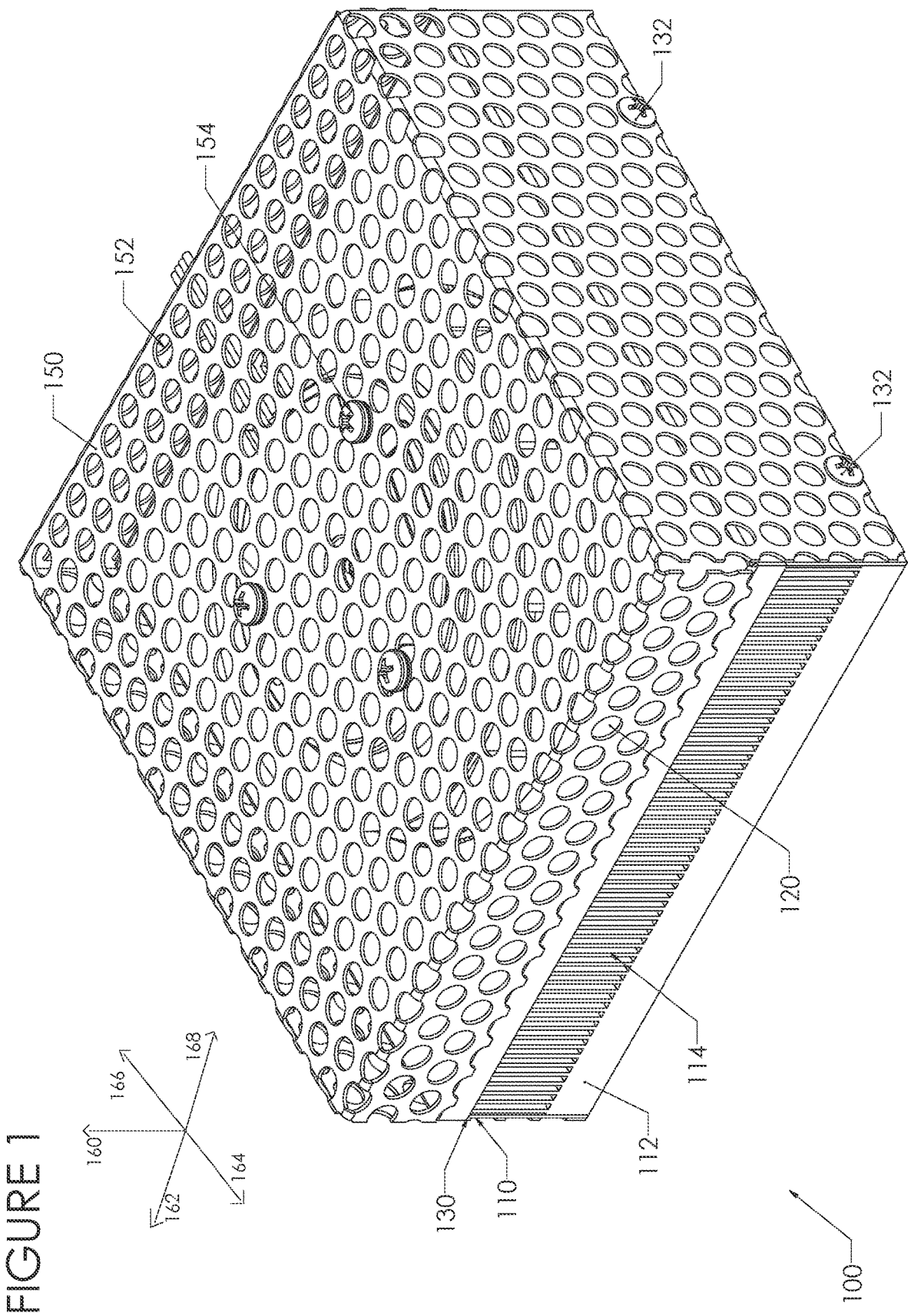
FIG. 1 depicts a perspective view of a heat exchanger assembly.

With reference to FIG. 1, a perspective view of a heat exchanger assembly (100) is provided. As shown, a secondary medium is illustrated in this example as a heat exchanger (110) provided with a base (112) and an attached fin field (114). A fluid mover (120) is provided in the assembly (100) to force fluid, e.g. air, through the fin field (114). In this assembly, the fluid mover (120) is a fan impeller, although this embodiment should not be considered limiting. It is understood in the art that motorized impeller fans have a high volumetric flow rate and pressure. One of the challenges with this type of fluid mover is the attachment to the heat exchanger (110). A blade assembly within the motorized impeller fan (120) is subject to rotation while a corresponding motor assembly is stationary.

As shown herein, a housing (150) is provided and positioned relative to the heat exchanger (110) and the fluid mover (120). The housing (150) is shown with a plurality of fenestrations (152), e.g. openings. The fenestrations (152) are shown to have an arcuate shape, e.g. round or circular, although this shape should not be considered limiting. In one embodiment, the fenestrations (152) may have a different shape or configuration, as shown and described below in FIGS. 11A, 11B, and 11C. The housing (150) is positioned to cover or otherwise extend over the fluid mover (120). An attachment mechanism (154) is shown to secure or otherwise attached the fluid mover (120) to the housing (150). The quantity of attachment mechanisms (154) should not be considered limiting. In addition, although the attachment mechanism (154) is shown as a screw, this embodiment of the attachment mechanism (154) should not be considered limiting, and in one embodiment, an alternative form of the attachment mechanism may be employed to secure or otherwise support the fluid mover (120) with respect to the housing (150). The housing (150) is shown secured or otherwise attached to the heat exchanger (110) through a plenum (130). In the example shown herein, the plenum (130) is attached to the base (112) of the heat exchanger (110) through an attachment mechanism (132). The quantity and form of the attachment mechanisms (132) should not be considered limiting. In one embodiment, an alternative mechanism and/or an alternative quantity of mechanisms may be utilized. Accordingly, as shown herein, the housing (150) is positioned relative to the plenum (130) which is secured to the heat exchanger (110) and relative to the fluid mover (120).

As the fluid mover (120) is subject to rotation, a fluid flow and corresponding exhaust is formed. The housing fenestrations (152) provide an avenue for the fluid to flow. The arrows (160)-(168) are provided to illustrate directional flow of the fluid in the form of egress through the housing fenestrations (152). It is understood that the fenestrations (152) may function as egress ports to exhaust fluid caused by the fluid mover (120) and away from the corresponding secondary medium (110) in multiple directions (160)-(168). In one embodiment, the functionality of the fenestrations (152) and the fluid mover may be inverted, such that the fenestrations function as ingress ports to direct fluid flow toward the secondary medium (110). With functioning as ingress ports or egress ports, the housing fenestrations (152) function as a safety barrier from the fluid mover (120). Accordingly the housing (150) together with the associated fenestrations (152) function as a support to the impeller, while enabling a multi-direction flow of fluid with respect to the corresponding secondary medium (110).

Figure 2:
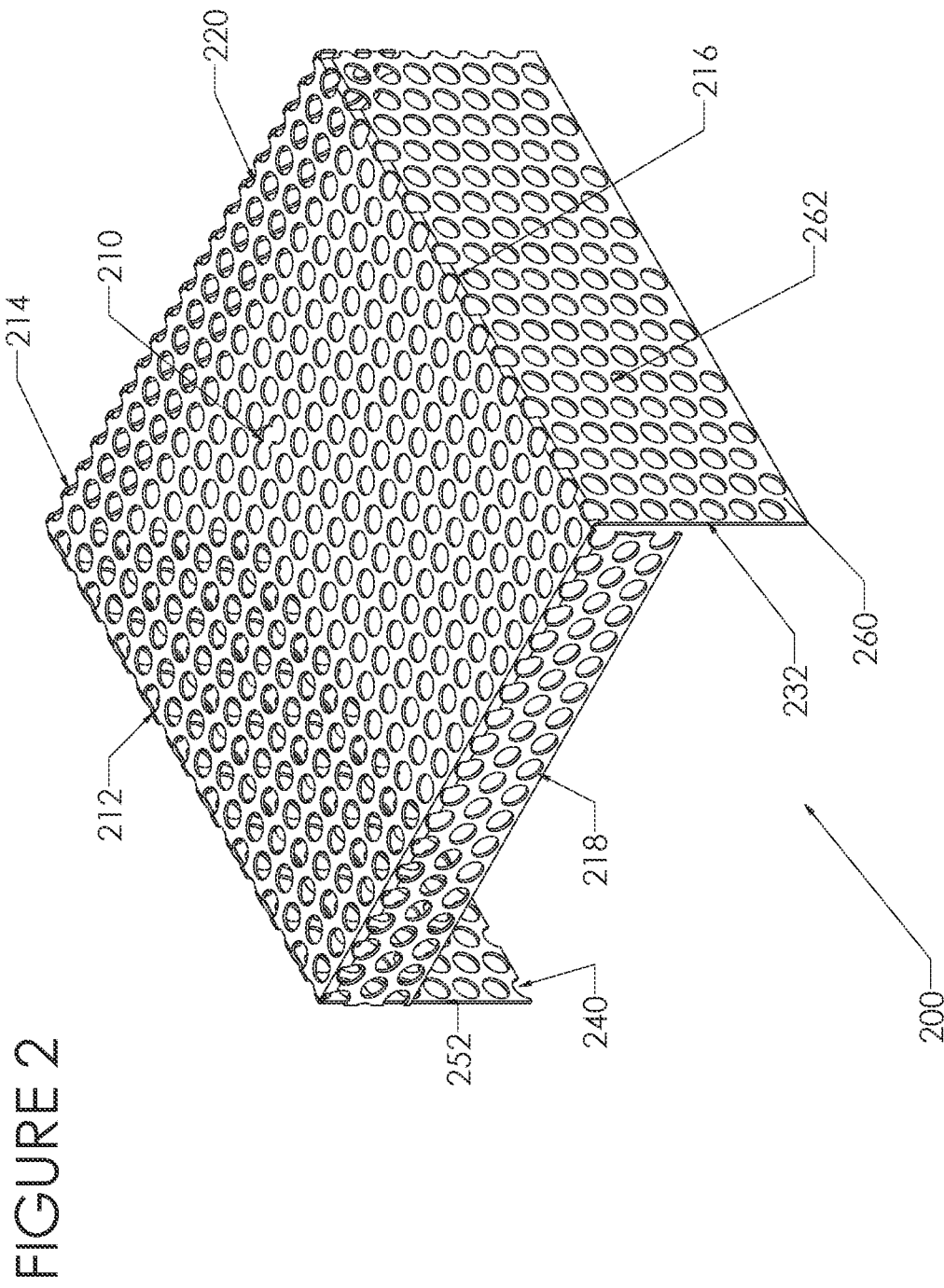
FIG. 2 depicts a perspective view of the housing of the heat exchanger assembly shown and described in FIG. 1.

Referring to FIG. 2, a perspective view (200) of the housing shown and described in FIG. 1 is provided. As shown, a planar region or surface (210) is provided with a plurality of fenestrations (212) placed across the surface (210). The fenestrations (212) are shown herein with an arcuate shape, although the shape of the fenestrations should not be considered limiting. A plurality of vertical or near vertical walls is shown in communication with the surface (210). Walls (230) and (240) are shown extending from oppositely disposed walls (214) and (216), respectively, and in communication with the surface (210). The walls (230) and (240) are parallel to each other, and both orthogonal to the surface (210). Each of the walls (230) and (240) has a length (232) and (242), respectively, extending from the surface (210). Walls (250) and (260) are shown extending from oppositely disposed walls (218) and (220), respectively, and in communication with the surface (210). The walls (250) and (260) are parallel to each other and orthogonal to the surface (210) and orthogonal to walls (230) and (240). Each of the walls (250) and (260) has a length (252) and (262), respectively, extending from the surface (210). As shown herein, the lengths (252) and (262) are relatively or substantially equal and less than the lengths (232) and (242), which are also relatively or substantially equal in length. Accordingly, as shown herein, the housing is provided with a plurality of walls having a plurality of fenestrations positioned across each of the walls.

Figure 3:
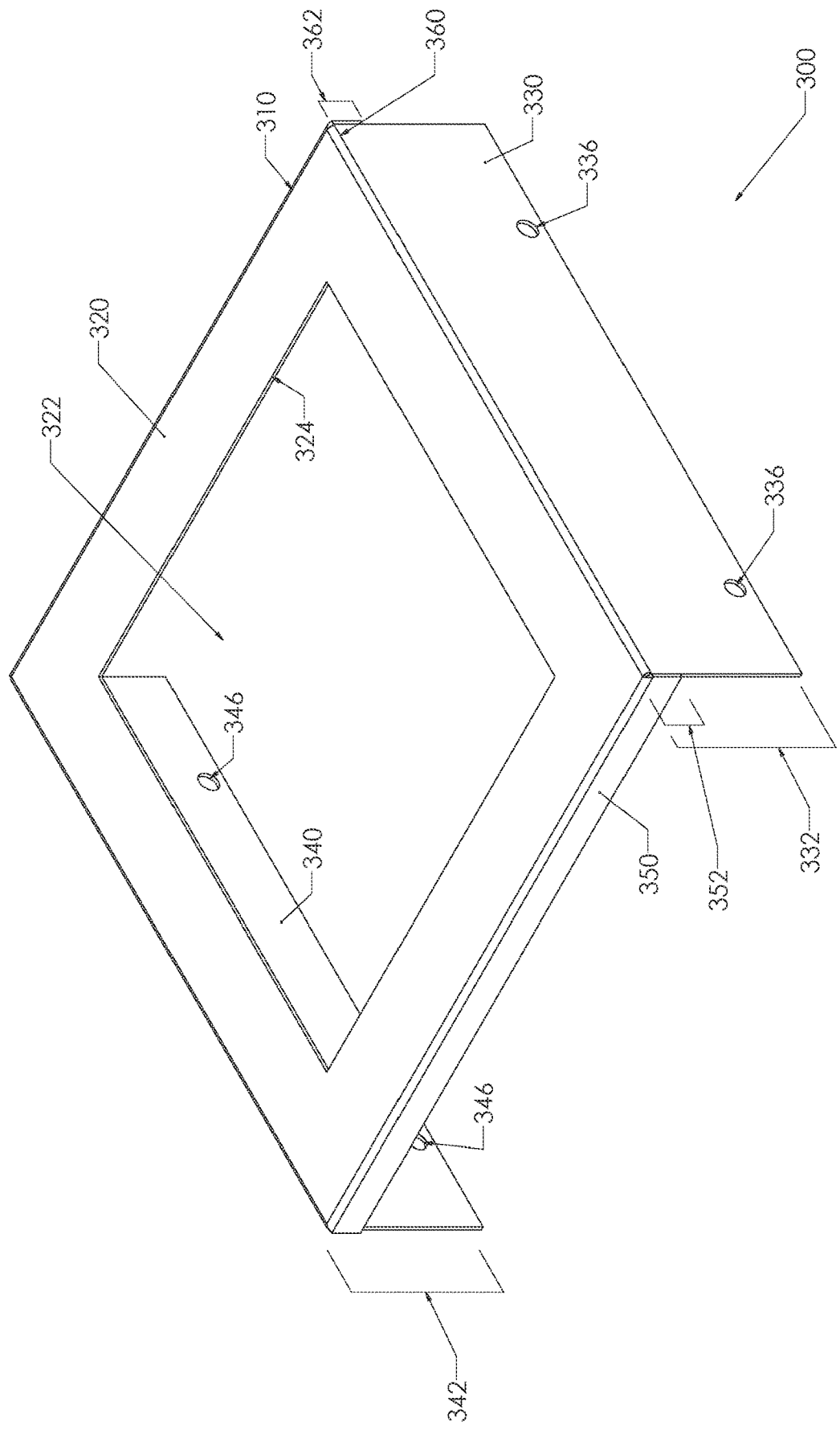
FIG. 3 depicts a perspective view of an embodiment of a plenum for adaptation with the heat exchanger assembly described in FIG. 1.

The plenum is provided in the housing assembly, although with limited visibility in the perspective view of the assembly shown in FIG. 1. Referring to FIG. 3, a perspective view (300) of one embodiment of a plenum for adaptation with the assembly of FIG. 1 is shown. The plenum functions within the assembly to position the fluid mover and direct a corresponding fluid flow toward or away from a proximally positioned secondary medium, such as a heat exchanger, printed circuit board, computer chassis, etc. As shown, the plenum (310) has a shape commensurate with a shape of a secondary medium. In one embodiment, the secondary medium may have a different geometric shape, and the shape of the plenum would be modified to match or corresponding to the shape or profile of the assembly. As shown, the plenum (310) has a planar surface (320) with a primary aperture (322), also referred to herein as a centrally positioned aperture (322). In the embodiment shown herein, the primary aperture has a four sided shape, which may be a square or rectangular shaped opening. Once assembled, the aperture (322) functions to receive the fluid mover. In one embodiment, the aperture (322) is sized to ensure that the received fluid mover does not interfere or cause friction with the perimeter (324) of the aperture (322). Accordingly, the aperture (322) is sized to receive the fluid mover.

A plurality of walls is provided extending from and in communication with the planar surface (320), including a first pair of walls (330) and (340), and a second pair of walls (350) and (360), respectively. The first pair of walls (330) and (340) has a length (332) and (342), respectively. In one embodiment, the lengths (332) and (342) are the same. Similarly, in one embodiment, the lengths (332) and (342) are the same or relatively equal to the lengths (232) and (242), respectively. As shown, the walls (330) and (340) are provided with secondary apertures (336) and (346), respectively. Each of the secondary apertures (336) and (346) are configured to receive an attachment mechanism (not shown) to secure the plenum (310) to the proximally positioned secondary medium, as shown in FIG. 1. The second pair of walls (350) and (360) has a length (352) and (362), respectively. In one embodiment, the lengths (352) and (362) are the same. Similarly, in one embodiment, the lengths (352) and (362) are the same or relatively equal to the length (252) and (262), respectively. In one embodiment, the second pair of walls (350) and (360) is referred to as a lip, as shown in FIG. 1 at (190) with limited visibility. Once assembled proximal to the secondary medium, the lip (350) and (360) function to prevent premature egress of the fluid flow from the secondary medium, which in the example of a heat exchanger prevents premature egress of fluid flow from the fin field (114). In one embodiment, the length (352) and (362) may be optimized through computational fluid dynamics (CFD) depending on the heat exchanger fin height and fan curve.

Figure 4:
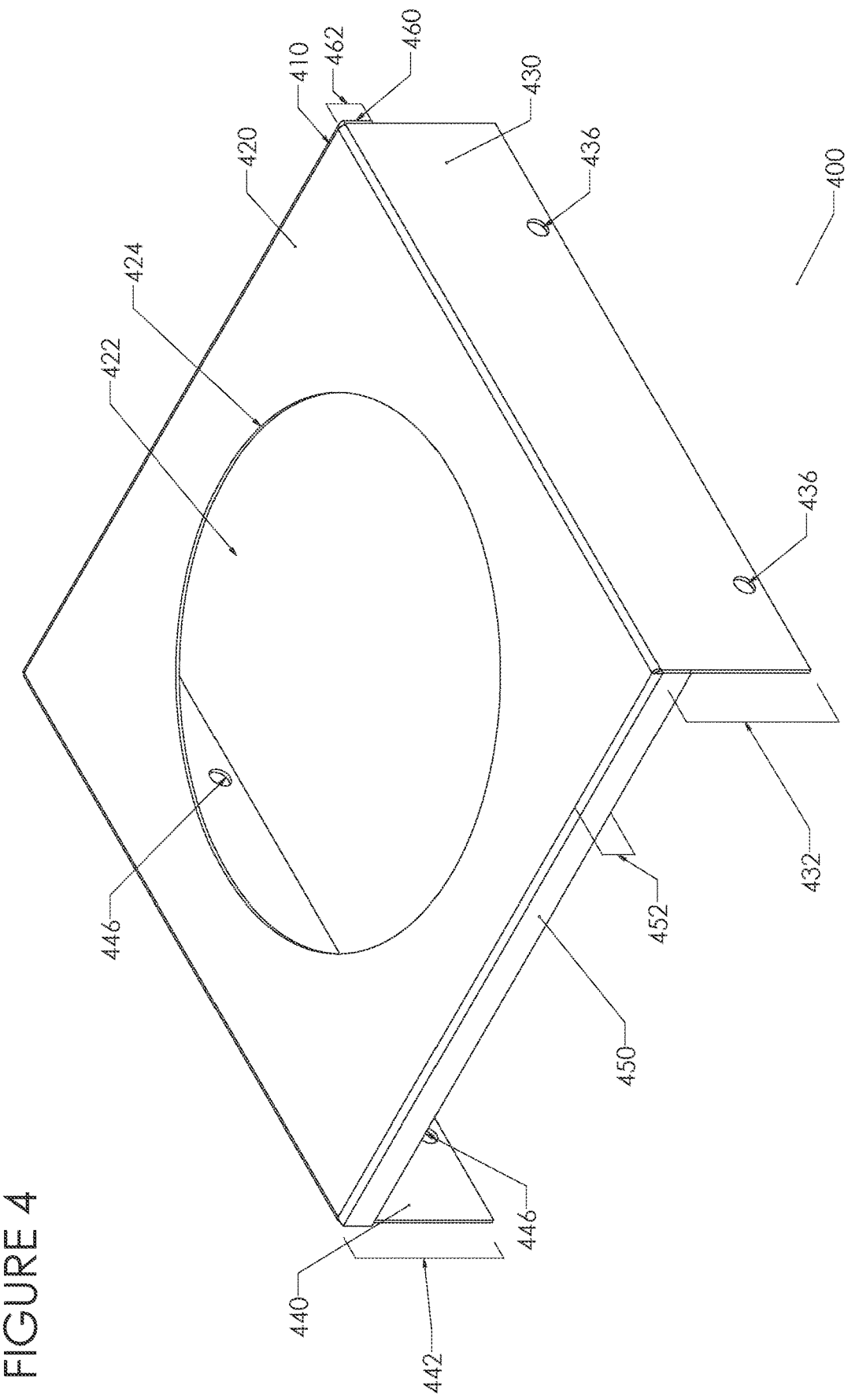
FIG. 4 depicts a perspective view of an embodiment of a plenum for adaptation with the heat exchanger assembly described in FIG. 1.

It is understood that the size and shape of the primary aperture (322) of the plenum (310) should not be considered limiting. Referring to FIG. 4, a perspective view (400) of one embodiment of a plenum for adaptation with the assembly of FIG. 1 is shown. The plenum (410) has a shape commensurate with the shape of the assembly (100) and corresponding heat exchanger (110). In one embodiment, the assembly and corresponding heat exchanger may have a different geometric shape, and the shape of the plenum would be modified to match that of the assembly. As shown, the plenum (410) has a planar surface (420) with a primary aperture (422), also referred to as a centrally positioned aperture (422). In the embodiment shown herein, the primary aperture has an arcuate shape, which may be a circle or elliptical shaped opening. Once assembled, the central aperture (422) functions to receive the fluid mover. In one embodiment, the aperture (422) is sized to ensure that the received fluid mover does not interfere or cause friction with the perimeter (424) of the central aperture (422). Accordingly, the aperture of size to receive the fluid mover.

Similar to the plenum shown in FIG. 3, a plurality of walls is provided extending from and in communication with the planar surface (420), including a first pair of walls (430) and (440), and a second pair of walls (450) and (460), respectively. The first pair of walls (430) and (440) has a length (432) and (442), respectively. In one embodiment, the lengths (432) and (442) are the same. Similarly, in one embodiment, the lengths (432) and (442) are the same or relatively equal to the lengths (232) and (242), respectively. As shown, the walls (430) and (440) are provided with secondary apertures (436) and (446), respectively. Each of the secondary apertures (436) and (446) are configured to receive an attachment mechanism (not shown) to secure the plenum (410) to a proximally positioned secondary medium, as shown in FIG. 1. The second pair of walls (450) and (460) has a length (452) and (462), respectively. In one embodiment, the lengths (452) and (462) are the same. Similarly, in one embodiment, the lengths (452) and (462) are the same or relatively equal to the length (252) and (262), respectively. In one embodiment, the second pair of walls (450) and (460) is referred to as a lip, as shown in FIG. 1 at (190) with limited visibility. When assembled proximal to the heat exchanger, the lip (450) and (460) function to prevent premature egress of the fluid flow from the fin field (114). In one embodiment, the length (452) and (462) may be optimized through computational fluid dynamics (CFD) depending on the heat exchanger fin height and fan curve. Accordingly, the plenum (410) has similar functionality to the plenum shown and described in FIG. 3, with a different geometric characteristic of the primary aperture (422).

Figure 5:
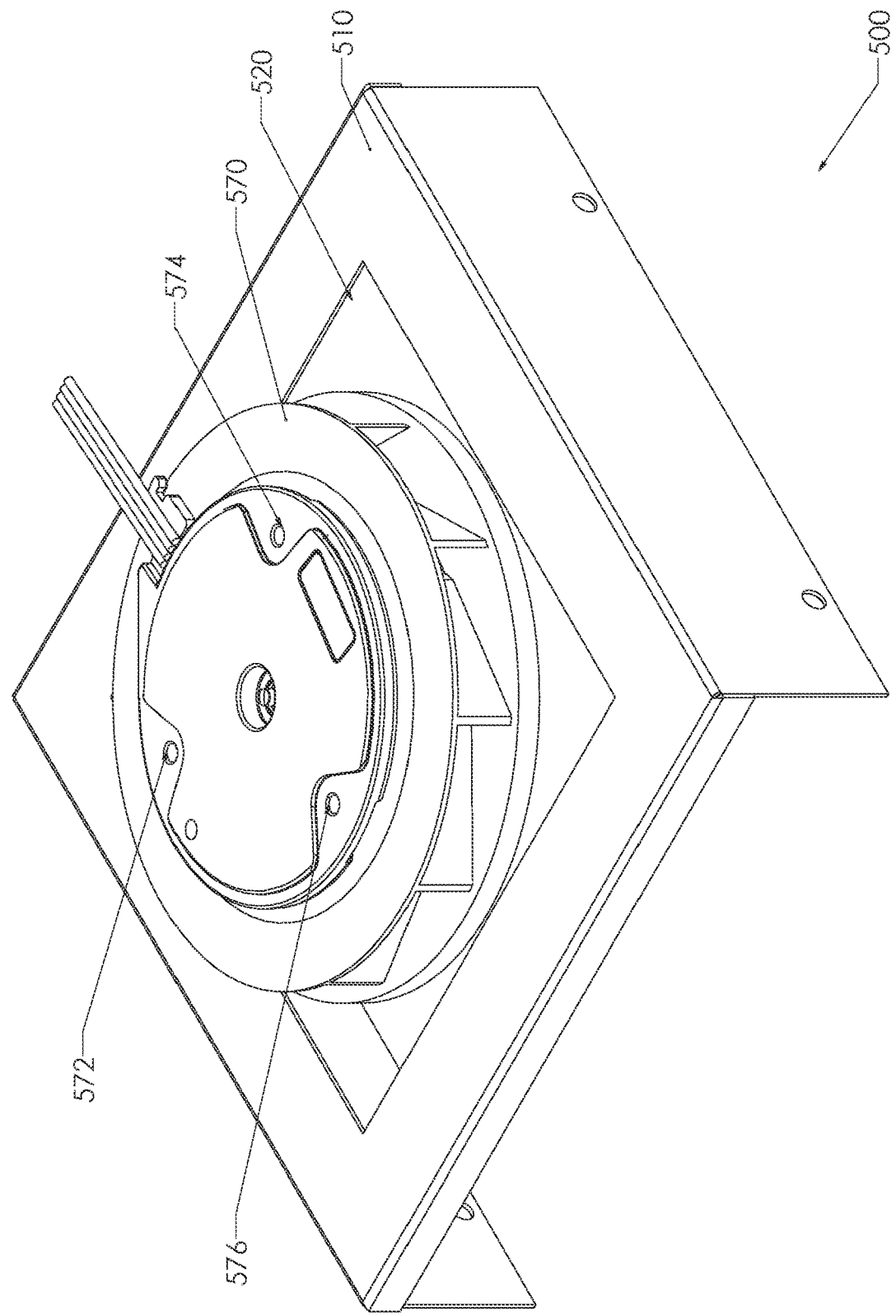
FIG. 5 depicts a perspective view of an assembly of the plenum and an associated fan impeller.

Referring to FIG. 5, a perspective view (500) of an assembly of the plenum and an associated fan impeller is shown. In the embodiment, shown herein, the plenum (510) includes the properties of the plenum (310) shown and described in FIG. 3. The plenum (510) includes a primary opening or aperture (520), which is shown receiving or in communication with a fluid mover (570). As shown and described in FIG. 1, the fluid mover (570) is secured to the housing (not shown). A plurality of secondary apertures (572), (574), and (576) are shown provided with the fluid mover (570). The secondary apertures (572), (574), and (576) are configured to receive a corresponding attachment mechanism to secure the fluid mover (570) to the housing (150). When operating, the fluid mover (570) is subject to rotation within the aperture (520). In one embodiment and once secured, the fluid mover (570) is effectively suspended from the housing (150). Although the secondary openings (572), (574), and (576) are configured to receive screws, in one embodiment, any mechanical fastening mechanism or technique may be employed, including but not limited to welding or brazing. Accordingly, the assembly shown herein illustrates positioning and receipt of the fluid mover within the four sided primary aperture (520) of the plenum (510).

Figure 6:
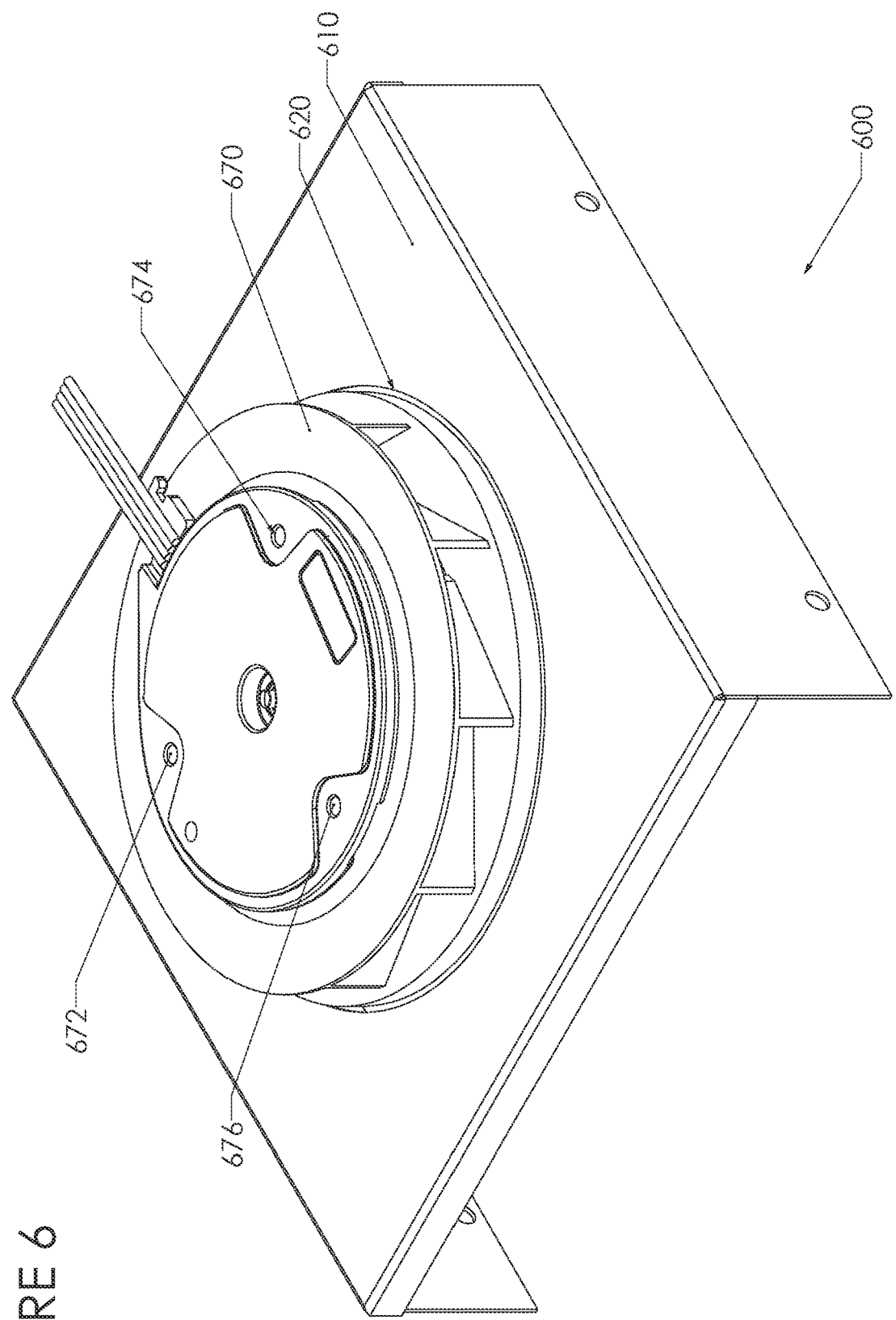
FIG. 6 depicts a perspective view of an assembly of the plenum and an associated fan impeller.

Referring to FIG. 6, a perspective view (600) of an assembly of the plenum and an associated fluid mover is shown. In the embodiment, shown herein, the plenum (610) includes the properties of the plenum (410) shown and described in FIG. 4. The plenum (610) includes a primary opening or aperture (620), which is shown receiving or in communication with a fluid mover (670). As shown and described in FIG. 1, the fluid mover (670) is secured to the housing (not shown). A plurality of secondary apertures (672), (674), and (676) are shown provided with the fluid mover (670). The secondary apertures (672), (674), and (676) are configured to receive a corresponding attachment mechanism to secure the fluid mover (670) to the housing. When operating, the fluid mover (670) is subject to rotation within the aperture (620). In one embodiment and once secured, the fluid mover (670) is effectively suspended from the housing. Although the secondary openings (572), (574), and (576) are configured to receive screws, in one embodiment, any mechanical fastening mechanism or technique may be employed, including but not limited to welding or brazing. Similarly, in one embodiment a different quantity of secondary openings may be provided. Accordingly, the assembly shown herein illustrates positioning and receipt of the fluid mover within the circular or arcuate shaped primary aperture (620) of the plenum (610).

Figure 7:
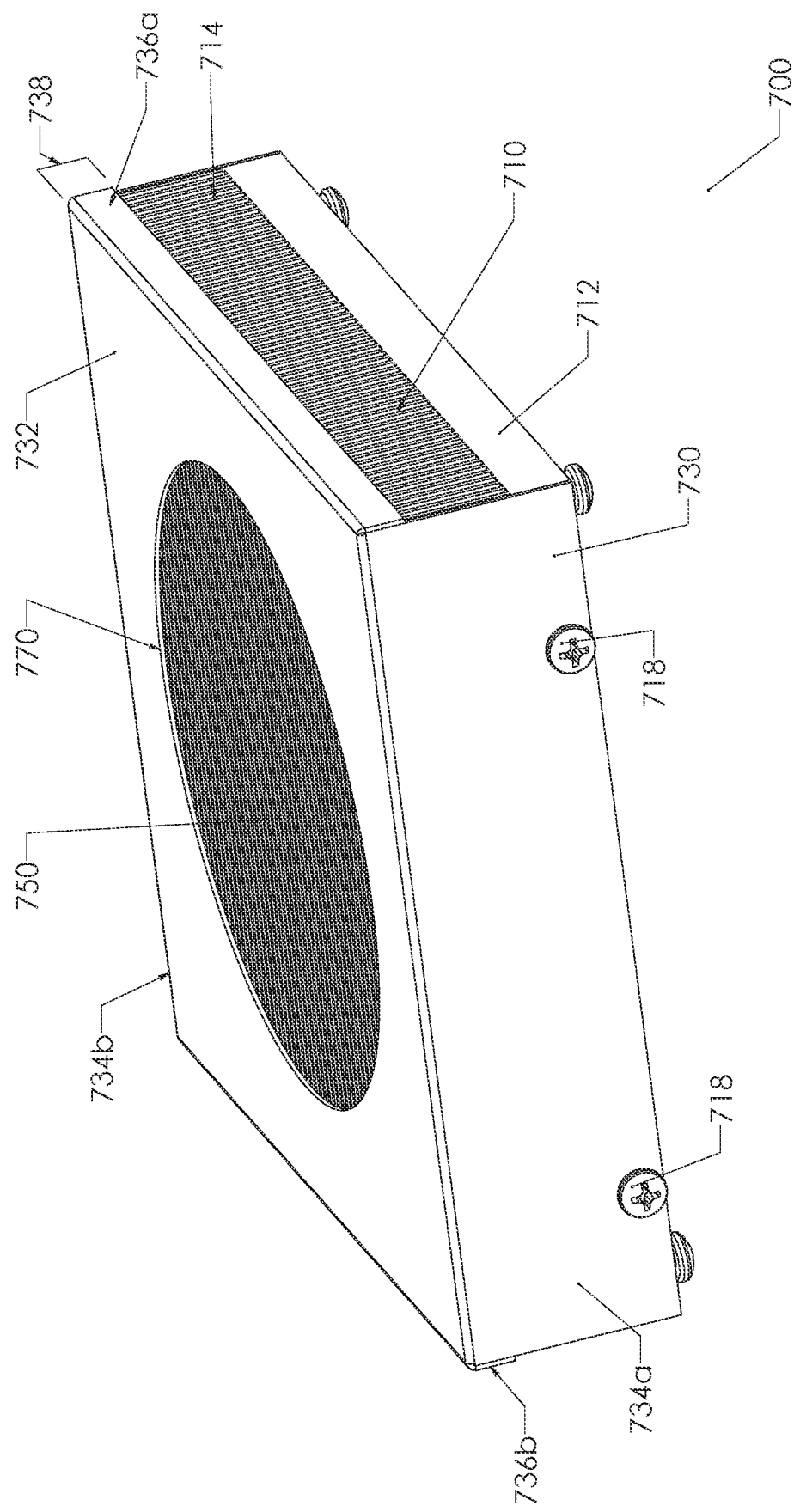
FIG. 7 depicts a schematic diagram to illustrate a plenum and positioning relative to the heat exchanger.

Referring to FIG. 7, a schematic diagram (700) is provided to illustrate a plenum (730) and positioning relative to the secondary medium in the form of a heat exchanger (710). As shown the plenum (730), also referred to herein as a plenum body, is positioned as an interface between the heat exchanger (710) and the housing (not shown in this illustration). The plenum (730) is shown attached or otherwise secured to the base (712) of the heat exchanger (710) through an attachment mechanism (718). The quantity and form of the attachment mechanism (718) should not be considered limiting. In one embodiment, an alternative mechanism and/or an alternative quantity of mechanisms may be utilized, including but not limited to solder, welding or brazing of the plenum (730) to the base (712). The plenum (730) is shown with an opening (750), hereinafter referred to as a primary opening. As shown, the primary opening (750) has an arcuate shape. It is understood that the shape of the opening should not be considered limiting, and in one embodiment, the primary opening (750) may have a different size and/or shape, as shown in FIGS. 4 and 6. The primary opening (750) is sized and shaped to receive the impeller fan (not shown in this illustration).

The plenum body (730) is provided with a wall or surface (732), referred to herein as a primary wall, surrounding the primary opening (750). As shown herein, the wall (732) and the opening (750) are co-planar, or in one embodiment relatively co-planar. In addition, the plenum body (730) is provided with a plurality of walls or surfaces extended perpendicular or relatively perpendicular with respect to the wall (732). A first set of secondary walls (734a) and (734b) are shown positioned perpendicular or relatively perpendicular to and in communication with the primary wall (732). In addition, a second set of secondary walls (736a) and (736b) are shown positioned in communication with the primary wall (732) and also orthogonal to both the primary wall (732) and the first set of secondary walls (734a) and (734b). Accordingly, the plenum body (730) is comprised of an arrangement of walls and a primary opening.

As shown herein, the first set of secondary walls (734a) and (734b) are secured to the base (732) of the heat exchanger (710) via the attachment mechanisms (718). The first set of secondary walls (734a) and (734b) are parallel or relatively parallel to the fin field (714) of the heat exchanger (710). As shown, the second set of secondary walls (736a) and (736b) do not extend to the base (712) of the heat exchanger (710). Rather, the secondary walls (736a) and (736b) extend over a select length (738) of the fin field (714). The length (738), which also referred to herein as a lip, functions to prevent fluid flow egress from the entrance to the fin field (714). The size (738) of the lip (736a) and (736b) may vary, with the size determined through optimization.

When positioned relative to the heat exchanger (710), the primary opening (750) of the plenum (730) functions to receive an impeller (not shown). A gap (770) is formed between the top (716) of the fin field (714) and the wall (732). In one embodiment, the minimum length of the lip (738) is equal to a size of the gap (770). Similarly, in one embodiment, the length of the lip (730) is determined through optimization. Accordingly, as shown herein, the plenum body (730) is sized and configured through optimization in order to receive the fluid mover and obtain an optimal fluid flow.

Figure 8:
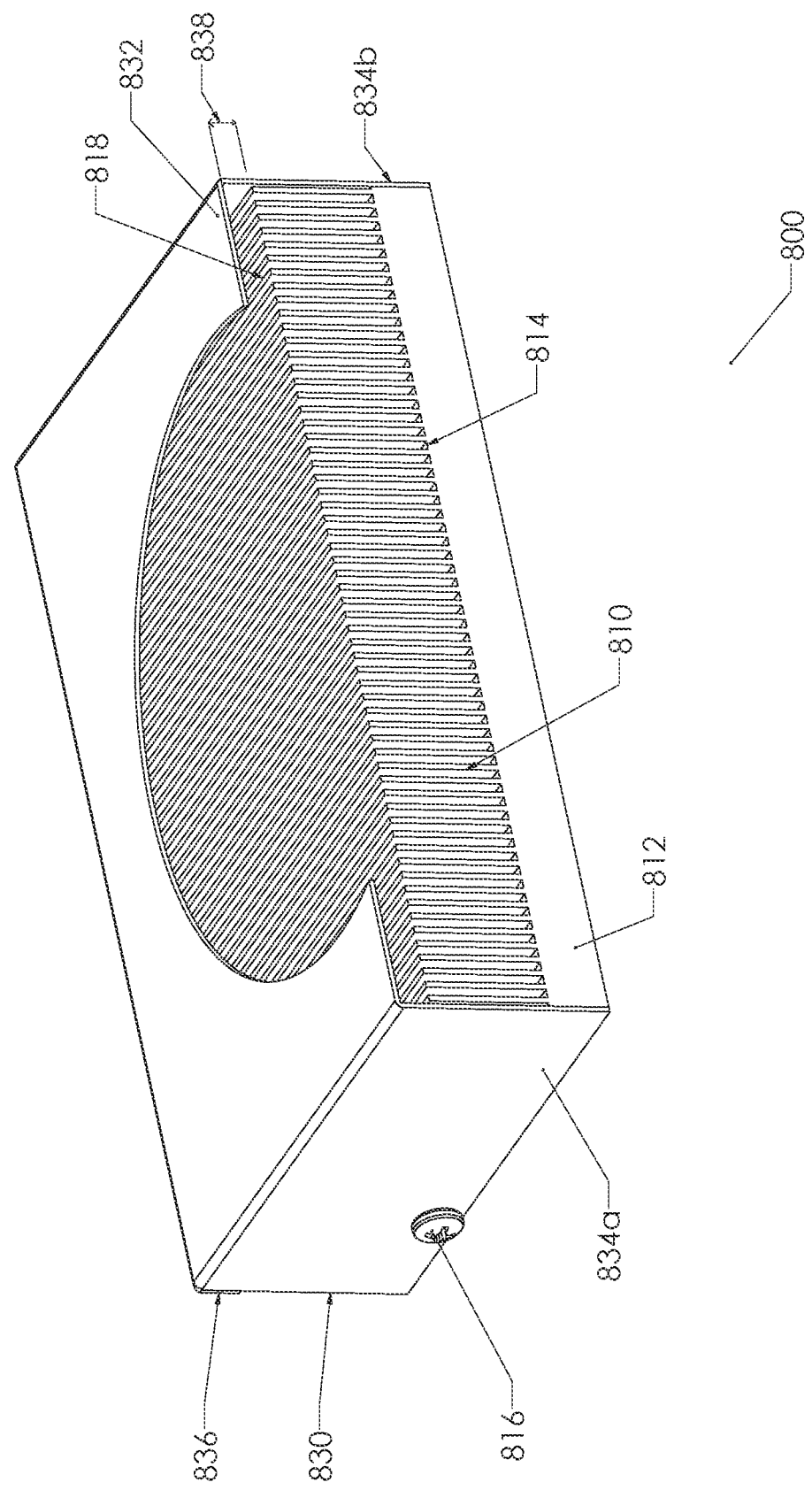
FIG. 8 depicts a sectional view to illustrate positioning of the plenum with respect to the heat exchanger.

Referring to FIG. 8, a sectional view (800) is provided to illustrate a positioning of the plenum with respect to the secondary medium in the form of a heat exchanger. As shown, the wall (834a) of the plenum body (830) is secured to the base (812) of the heat exchanger (810) through a securement mechanism (816). Although not visible in this view, in one embodiment, a corresponding attachment of the oppositely positional plenum wall (834b) to the base (812) may be provided. The fin field (814) is shown secured to the base (812). A gap (838) is formed between the top (818) of the fin field (814) and the primary wall (832) of the plenum body (830). The optimum dimension of the gap (838) may be determined through computational fluid dynamics (CFD), and in one embodiment analytical analysis. As shown and described in FIG. 4 below, in one embodiment there is a relationship between the dimension of the gap (818), and the length of the lip (836). Accordingly, the sectional view (800) illustrates a sectional view of the assembly without the housing or impeller.

Figure 9:
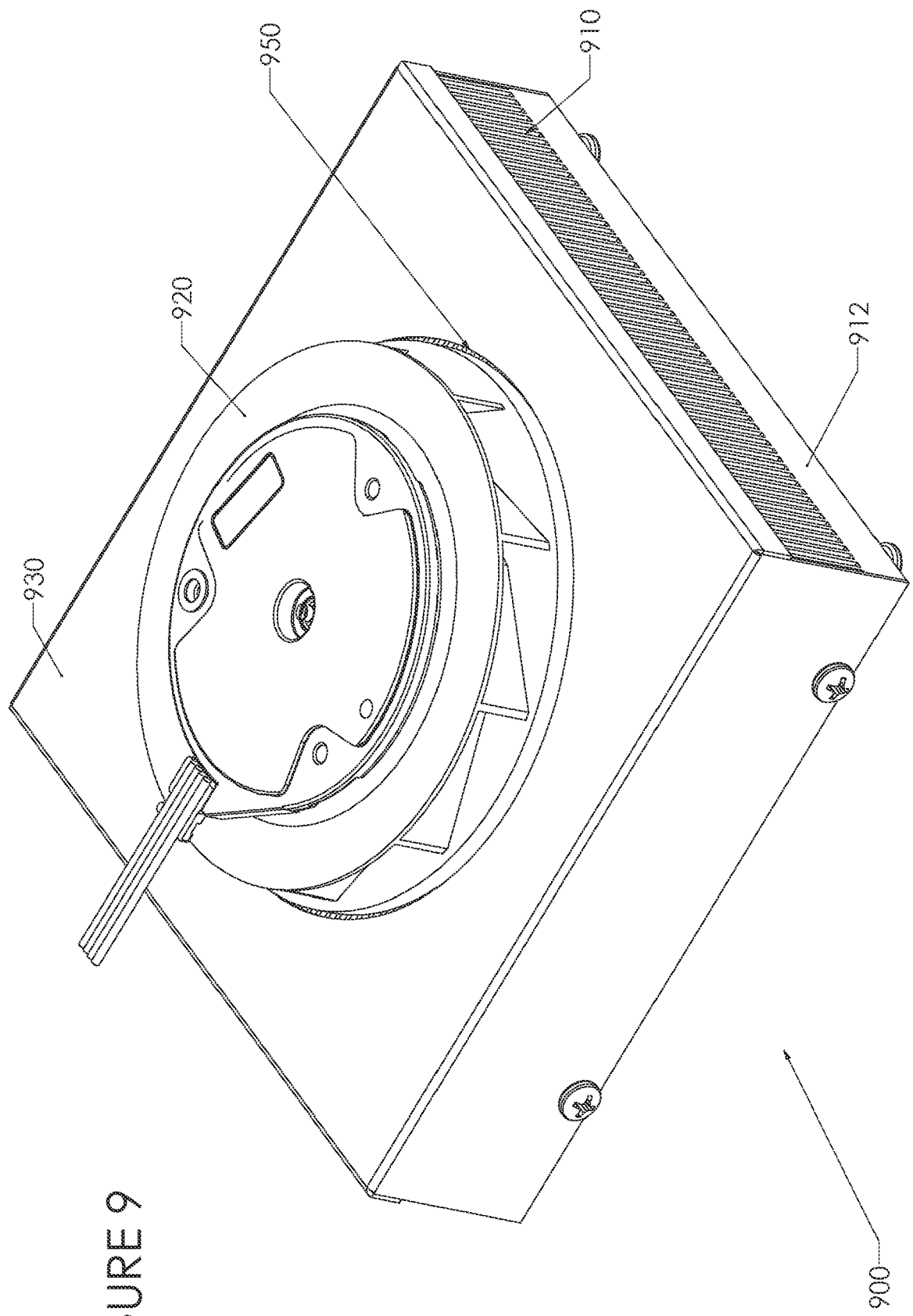
FIG. 9 depicts a schematic diagram to illustrate an assembly of the plenum together with the impeller, and without the housing.

As shown and described above, the assembly includes a fluid mover, such as an impeller or an alternative mechanism, to facilitate fluid flow. The primary opening in the plenum is configured to receive the fluid mover. Referring to FIG. 9, a schematic diagram (900) is provided to illustrate an assembly of the plenum together with the fluid mover positioned proximal to the secondary medium in the form of the heat exchanger, and without the housing. As shown, the plenum (930) is shown attached to the heat exchanger (910), and more specifically, attached to the base (912) of the heat exchanger (910). The fluid mover (920) is shown positioned within the primary opening (950). In one embodiment, the size of the primary opening (950) is slightly larger than the fluid mover diameter to prevent physical contact between the fluid mover (920) and the plenum (930), thereby mitigating or eliminating friction and loss associated with friction. The fluid mover (920) is shown configured to be received by the primary opening (950) and positioned proximal to the top (116) of the fin field (114). As shown in FIG. 1, the fluid mover (920) is secured to the housing (not shown), and in one embodiment is positioned in a suspended state from the housing and proximal to the secondary medium (910) in a suspended relationship. In one embodiment, the fluid mover (920) extends into the gap (318) thereby creating a reduced opening between the top (116) of the fin field (114) and the fluid mover (920).

Figure 10:
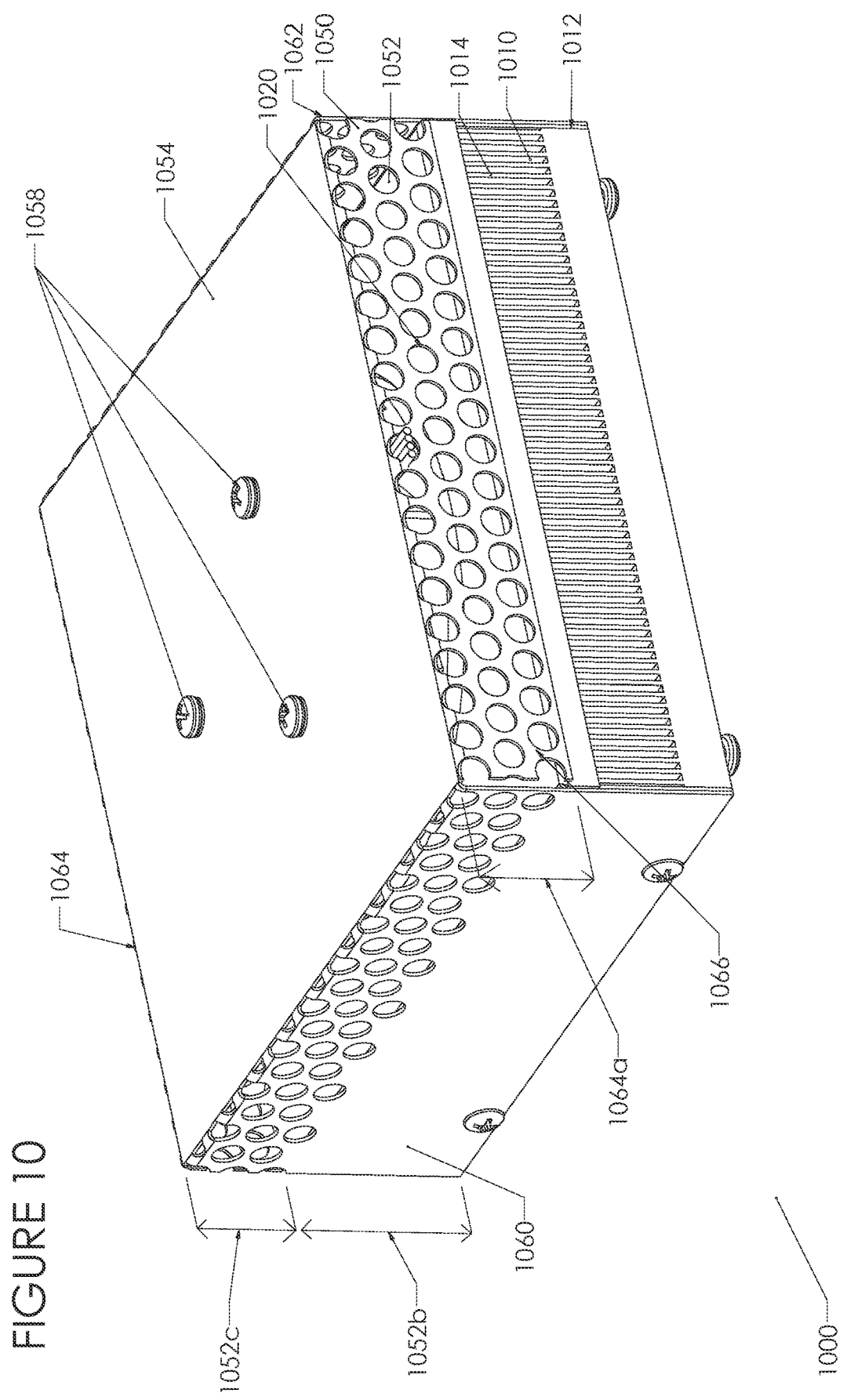
FIG. 10 depicts a perspective view of an alternative heat exchanger housing assembly.

Referring to FIG. 10, a perspective view of an alternative housing assembly (1000) is provided. Similar to the assembly shown and described in FIG. 1, a heat exchanger (1010) is provided with a base (1012) and an attached fin field (1014). As shown herein, a housing (1050) is provided and positioned relative to the heat exchanger (1010) and the fluid mover (1020). The housing (1050) is shown with a planar surface (1054) and a plurality of extending walls in communication with the planar surface (1054). The plurality of walls includes a first set of walls (1060) and (1062), and a second set of walls (1064) and (1066). In one embodiment, the first set of walls (1060) and (1062) are parallel or relatively parallel, and the second set of walls (1064) and (1066) are parallel or relatively parallel. A plurality of fenestrations (1052), e.g. openings, is positioned in the first and second sets of walls, although with a different arrangement than that shown and described in FIG. 1. The fenestrations (1052) are shown herein to have an arcuate shape, e.g. circular, although this shape should not be considered limiting. In one embodiment, the fenestrations (1052) may have a different shape or configuration, as shown and described below in FIGS. 11A, 11B, and 11C. The housing (1050) is positioned to cover or otherwise extend over the fluid mover (1020). An attachment mechanism (1058) is shown to secure or otherwise attach the fluid mover (1020) to the housing (1050) so that the fluid mover (1020) is suspended over the fin field (1014). Although three attachment mechanisms (1058) are shown herein, the quantity should not be considered limiting. In addition, although the attachment mechanism (1058) is shown as a screw, this embodiment of the attachment mechanism (1058) should not be considered limiting, and in one embodiment, an alternative from of the attachment mechanism may be employed to secure or otherwise support the fluid mover (1020) with respect to the housing (1050). The housing (1050) is shown secured or otherwise attached to the base (1012) of the heat exchanger (1010) through an attachment mechanism (1018). The quantity and form of the attachment mechanism (1018) should not be considered limiting. In one embodiment, an alternative mechanism and/or an alternative quantity of mechanisms may be utilized. Accordingly, as shown herein, the housing (1050) is positioned and secured to the heat exchanger (1010) and relative to the fluid mover (1020), and an arrangement of fenestrations (1052) are positioned across the secondary walls (1060)-(1066).

The fluid mover (1020) is positioned within the primary aperture of the plenum that is positioned within the housing to direct fluid, e.g. air, toward or away from the secondary medium. It is understood in the art that motorized fluid movers have a high volumetric flow rate and pressure. One of the challenges with this type of fluid mover is the attachment to the heat exchanger (1010). A blade assembly within the fluid mover (1020) is subject to rotation while a corresponding motor assembly is stationary.

The arrangement of fenestrations (1052) is different from the arrangement shown and described in FIG. 1. Namely, the housing (1050) includes a planar or relatively planar surface (1054) that is positioned parallel or relatively parallel to the planar or relatively planar surface (320) of the plenum shown in FIG. 3. In the embodiment shown herein, the planar surface (1054) is also referred to herein as a primary wall (1054). As shown, the primary wall (1054) is solid, e.g. no fenestrations, with the exception of openings (not shown) to receive the attachment mechanism(s) (1058) to secure the fluid mover (1020). Secondary walls of the housing (1050) are shown in communication with the primary wall. Namely, the first set of secondary walls (1060) and (1062) is shown positioned perpendicular to the surface (1054) and parallel to the fin field (1014), and the second set of secondary walls (1064) and (1066) is shown positioned perpendicular to the surface (1054) and orthogonal to the first set of secondary walls (1060) and (1062).

The plurality of fenestrations (1052) is shown positioned in both the first and second sets of secondary walls (1060)-(1066). The fenestrations (1052) are shown positioned relative to the height of the fin field (1014). An area (1052*b*) of the secondary walls (1060) and (1062) positioned proximal and parallel to the fin field (1014) is solid and does not include any fenestrations. In one embodiment, the area (1052*c*) of the secondary walls (1060) and (1062) with fenestrations (1052) extends from the planar surface (not shown) of the plenum to the primary surface (1054). Secondary walls (1064) and (1066) are configured with a similar selection and arrangement of fenestrations to that shown in secondary walls (1060) and (1062). Secondary walls (1064) and (1066) each have a length (1064*a*) that extends from the surface (1054) to the height of the fin field (1014). In one embodiment, the length of (1052*c*) and the length of (1064*a*) are the same, or substantially equal. Accordingly, the housing assembly shown herein has a similar arrangement of secondary walls to the housing shown in FIG. 1, but with a different arrangement of fenestrations to the housing assembly shown and described in FIG. 1.

Figure 11A:
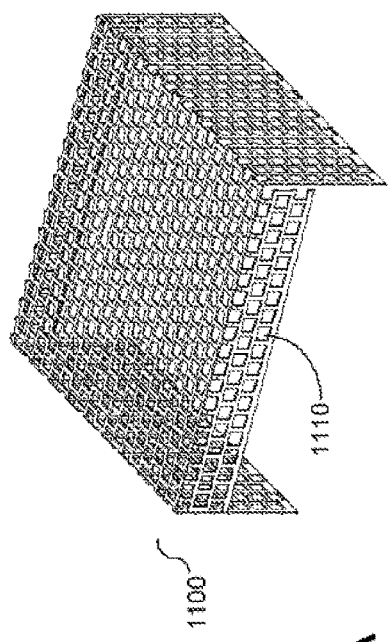
FIGS. 11A-11C depicts perspective views of the housing assembly from FIG. 2.
Figure 11B:
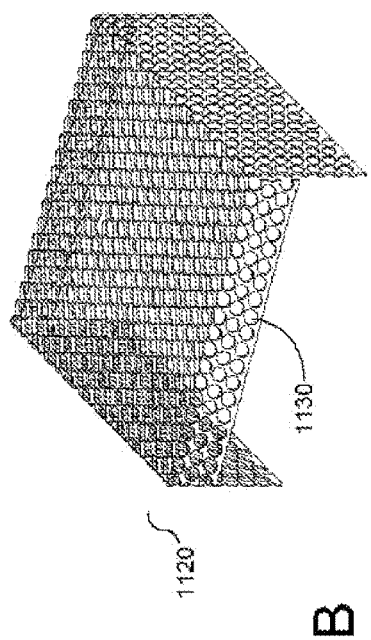
Figure 11C:
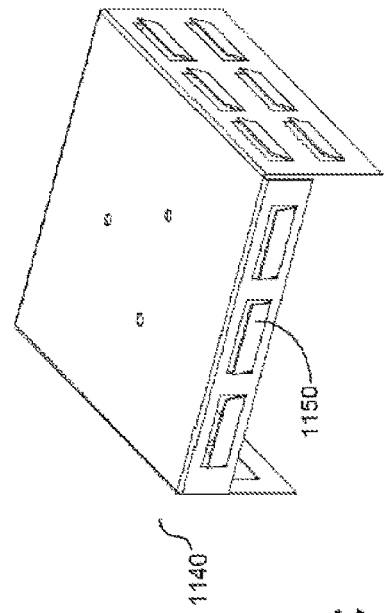

As shown and described above, the housing assembly is configured with fenestrations, and in one embodiment different arrangement of fenestrations. Although the fenestrations are shown with a circular or arcuate shape, this shape should not be considered limiting. Referring to FIG. 11A, a perspective view (1100) of the housing assembly from FIG. 2 is shown with 4-sided fenestrations (1110), which may be square and/or rectangular shaped. Similarly, FIG. 11B is a perspective view (1120) of the housing assembly from FIG. 2 with arcuate fenestrations (1130) having an elliptical shape. Referring to FIG. 11C, a perspective view (1140) of the housing assembly from FIG. 2 is shown with fenestrations (1150) in the form of louvers. In one embodiment, the fenestrations may be square, rectangular, round, oval, 6-sides, 8-sides, etc., and as such the geometrical properties of the fenestrations should not be considered limiting.

The housing assembly shown and described above can be applied to any size and shape of a corresponding heat exchanger. As shown in FIGS. 1, 5, 6, 9, and 10, the fluid mover is smaller than the corresponding heat exchanger, such as heat exchanger (110). In one embodiment and as described in detail below, the fluid mover may be larger than a corresponding footprint of the heat exchanger. Accordingly, the size and shape of the heat exchanger and proximally positioned fluid mover should not be considered limiting.

The embodiments shown and described in FIGS. 1-11C are directed at a heat exchanger having a four sided profile with a plenum and housing having a corresponding shape to complement the heat exchanger profile. It is understood in the art that the heat exchanger is not limited to a four sided profile. In one embodiment, the plenum and the housing may come in different profiles, with the scope of the embodiments directed at the assembly of the housing and/or plenum with respect to the heat exchanger, and as such, the scope of the embodiments should not be limited to the size and shape of the corresponding fluid mover.

Figure 12:
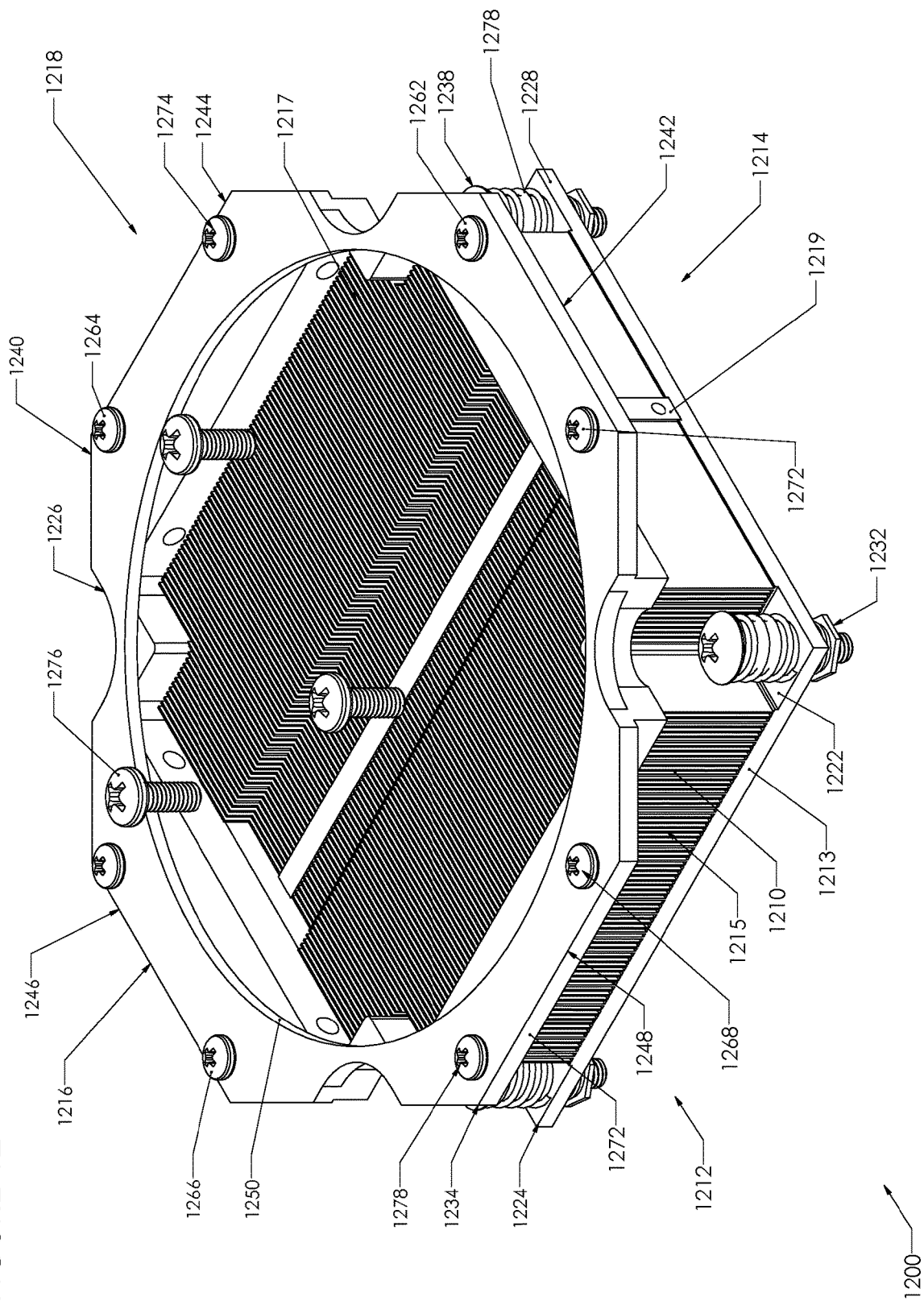
FIG. 12 depicts a perspective view of a four sided heat exchanger with an eight sided corresponding plenum.

Referring to FIG. 12, a perspective view (1200) of a four sided heat exchanger with an eight sided corresponding plenum is provided. As shown, the heat exchanger (1210) is comprised of four sides, including $side_0$ (1212), $side_1$ (1214), $side_2$ (1216), and $side_3$ (1218). An area is provided between each of the adjacent sides to receive an attachment mechanism to secure the heat exchanger (1210) to a secondary surface. Three of those areas are visible in this view, including $area_0$ (1222) positioned between $side_0$ (1212) and $side_1$ (1214), $area_1$ (1224) positioned between $side_0$ (1212) and $side_2$ (1216), $area_2$ (1226) positioned between $side_2$ (1216) and $side_3$ (1218), and $area_3$ (1228) positioned between $side_3$ (1218) and $side_1$ (1214). An opening (not shown) is provided in each of the respective areas and is configured to receive a corresponding attachment mechanism. As shown, $attachment\ mechanism_0$ (1232) is received in $area_0$ (1222), $attachment\ mechanism_1$ (1234) is received in $area_1$ (1224), $attachment\ mechanism_2$ (not shown) is received in $area_2$ (1226), and $attachment\ mechanism_3$ (1238) is received in $area_3$ (1228). Although the attachment mechanisms shown herein are mechanical screws, this embodiment should not be considered limiting, and in one embodiment, an alternative mechanism may be employed to attached and/or secure the heat exchanger (1210) to the secondary surface (not shown).

Similar to the assembly shown in FIG. 1, the partial assembly shown in FIG. 12 includes a plenum (1240) proximally positioned with respect to the heat exchanger (1210). As shown, the heat exchanger (1210) is provided with a base (1213) and a fin field (1215) in communication with the base (1213). The plenum (1240) has a profile that corresponds to the profile of the base (1213), including cut-outs for the defined areas (1222)-(1228). More specifically, the plenum (1240) is shown with four primary sides, including $side_0$ (1242), $side_1$ (1244), $side_2$ (1246), and $side_3$ (1248). $Side_0$ (1242) and $side_2$ (1246) are parallel to each other and parallel to the fin field (1215), and have a same or similar first length. $Side_1$ (1244) and $side_3$ (1248) are parallel to each other and perpendicular to the fin field (1215), and have a same or similar second length. Each of $side_0$ (1242) and $side_2$ (1246) is shown as a solid element that is fixed or otherwise secured to the heat exchanger (1210). The corresponding fin field (1215) is shown with a bar (1217), also referred to herein as a fixed element, extending perpendicular to the fin field (1215) and across a width (or in one embodiment a length) of the base (1213). The plenum (1240) is shown with an attachment mechanism (1219) secured to the bar (1217). In one embodiment, a second attachment mechanism (not shown) is positioned on an opposite side of the assembly to further secure the plenum (1240) to the bar (1217). Similar to the plenum shown and described in FIG. 1, $side_1$ (1244) and $side_3$ (1248) have the same or similar length and are parallel or relatively parallel to each other while orthogonal to the fin field (1215). Each of $side_1$ (1244) and $side_3$ (1248) extend across a top portion of the fin field (1215) with the length of the extension functioning to prevent premature egress of the fluid flow from the fin field (1215). In one embodiment, the lengths of $side_1$ (1244) and $side_3$ (1248) may be optimized through computational fluid dynamics (CFD) depending on the heat exchanger fin height and fan curve. Accordingly, the parallel positioning of $side_0$ (1242) and $side_2$ (1246) with respect to the fin field (1215) and the orthogonal positioning of $side_1$ (1244) and $side_3$ (1248) enables fluid to flow through the fin field, and functions as an avenue to enable a directed exit, e.g., exhaust, of the fluid from the fin field (1215).

As further shown, the plenum (1240) has a plurality of apertures, including a primary aperture (1250) and a plurality of secondary apertures. The primary aperture (1250) is shown with an arcuate or circular shape, although the shape of the opening should not be considered limiting. Similar to the plenum shown in FIG. 3, the primary aperture may have a four sided opening. The secondary apertures are proximally positioned relative to each of the sides (1242)-(1248) and are configured to receive the housing (not shown in this view). Each side of the plenum is shown with two secondary apertures, although the quantity of secondary apertures per side should not be considered limiting. In this example embodiment, $side_0$ (1242) is shown with secondary apertures (1262) and (1272), $side_1$ (1244) is shown with secondary apertures (1264) and (1274), $side_2$ (1246) is shown with secondary apertures (1266) and (1276), and $side_3$ (1248) is shown with secondary apertures (1268) and (1278). Accordingly, the primary aperture (1250) is configured to receive the fluid mover and the secondary apertures are configured to secure the housing to the plenum thereby forming the housing assembly.

Figure 13:
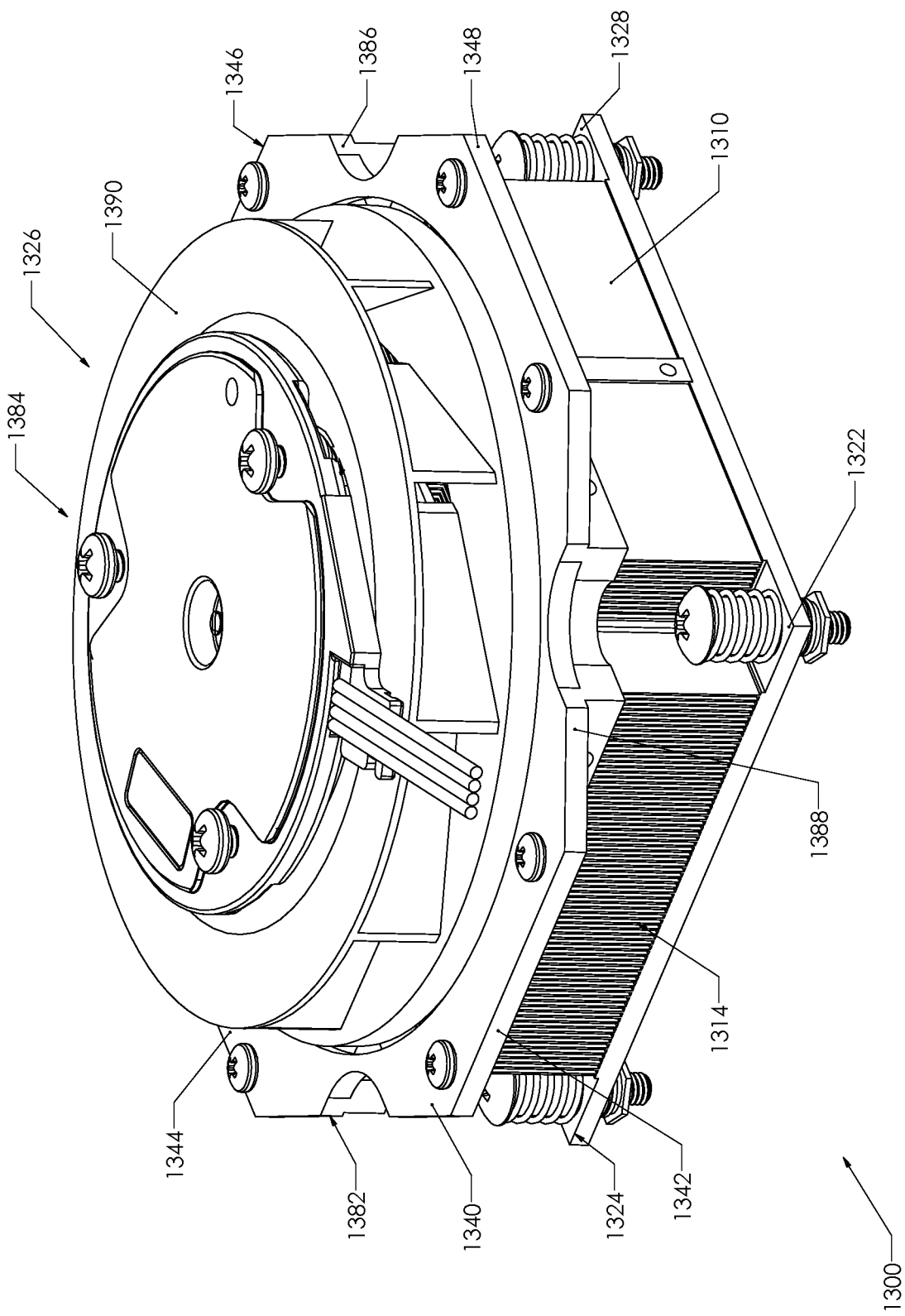
FIG. 13 depicts a perspective view of the heat exchanger assembly of FIG. 12 with the perforated housing removed.

Referring to FIG. 13, a perspective view (1300) of the heat exchanger assembly of FIG. 12 is shown with the perforated housing removed. The heat exchanger (1310) is shown with a proximally positioned and attached plenum (1340). As shown, the plenum (1340) covers the boundary of the fin field (1314) of the heat exchanger (1310). The plenum (1340) is further shown with four corners removed, including $area_0$ (1382) positioned between $side_0$ (1342) and $side_1$ (1344), $area_1$ (1384) positioned between $side_1$ (1344) and $side_2$ (1346), $area_2$ (1386) positioned between $side_2$ (1346) and $side_3$ (1348), and $area_3$ (1388) positioned between $side_3$ (1348) and $side_0$ (1342). The areas (1382)-(1388) are positioned proximal to areas (1322)-(1328) for ease of attachment of the heat exchanger (1310) to a secondary surface (not shown). As further shown, an impeller fan (1390) is positioned within the primary aperture (not shown) of the plenum (1340). In this example, the fluid mover (1390) has a size and profile adapted to be received in the primary aperture of the plenum (1340). At the same time, the fluid mover (1390) has a profile larger than the profile of the heat exchanger (1310). Accordingly, as demonstrated herein, the profile and size of the fluid mover (1390) may be greater than the profile and size of the heat exchanger.

Figure 14A:
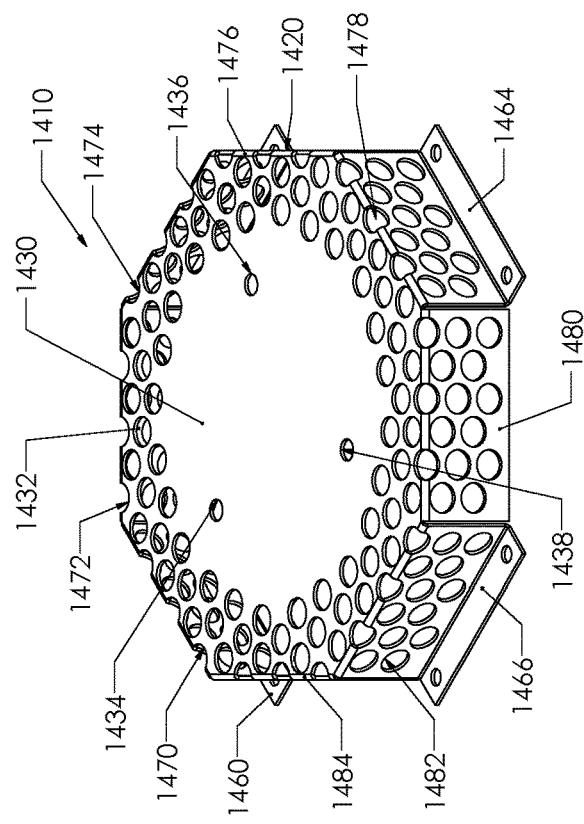
FIG. 14 depicts perspective views of the housing of FIG. 15, including a top perspective view and a bottom perspective view.
Figure 14B:
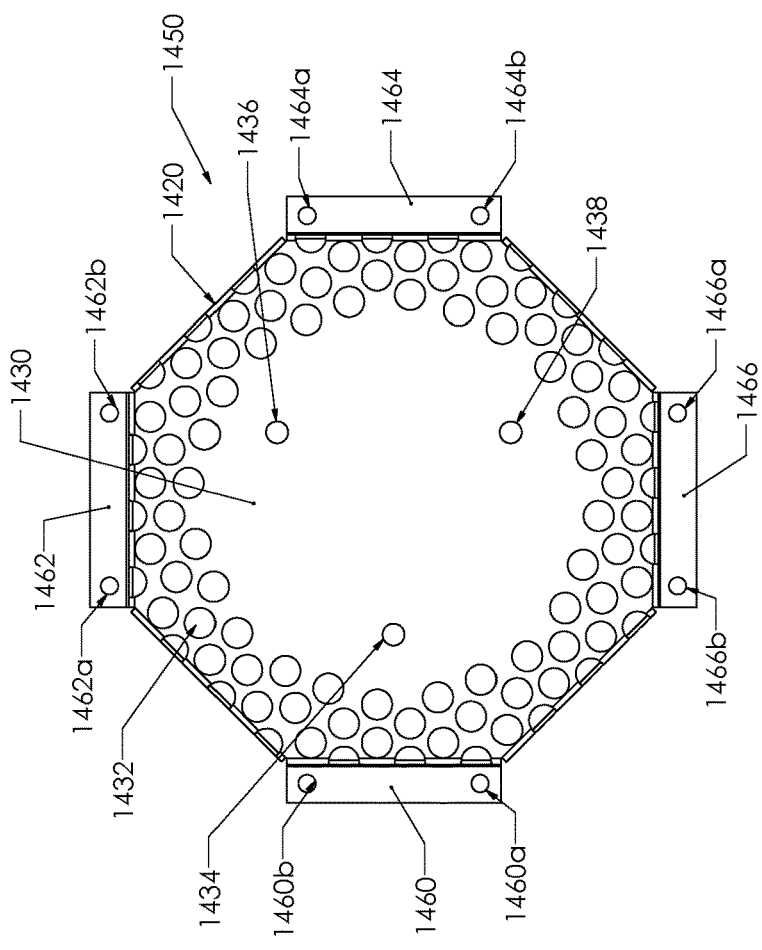

The partial assembly of the heat exchanger (1310) and the plenum (1340) shown and described in FIG. 13 is configured to receive a housing. Referring to FIGS. 14A and 14B, perspective views of the housing are provided, including a top perspective view (1410) in FIG. 14A and a bottom perspective view (1450) in FIG. 14B. As shown in view of the views, the housing (1420) is shown with a top surface (1430) with a plurality of fenestrations (1432), e.g. openings. The top surface (1430) shown herein includes an arrangement of the fenestrations positioned adjacent to the perimeter of the surface. This is merely one embodiment of the arrangement of fenestrations, and the arrangement should not be considered limiting. It is understood that the fenestrations (1432) function to as ingress or egress ports to direct fluid and fluid flow caused by the fluid mover (not shown) with respect to the corresponding heat exchanger (not shown) in multiple directions. In addition, the housing fenestrations (1432) function as a safety barrier from the fluid mover (not shown). In addition to the fenestrations, the surface (1430) includes a plurality of apertures (1434), (1436), and (1438), also referred to herein as housing primary apertures. Although three primary apertures (1434)-(1438) are shown, the quantity should not be considered limiting. The primary apertures (1434)-(1438) are positioned and configured to receive the fluid mover, and more specifically, to secure the fluid mover to the housing (1420).

The housing (1420) is shown in the form of an octagon. As further shown in the top view (1410) of FIG. 14A, the housing (1420) is provided with a plurality of side walls, shown herein as $wall_0$ (1470), $wall_1$ (1472), $wall_2$ (1474), $wall_3$ (1476), $wall_4$ (1478), $wall_5$ (1480), $wall_6$ (1482), and $wall_7$ (1484). Each of the side walls (1470)-(1484) is perpendicular to the top surface (1430) and is position adjacent to the corresponding side of the octagon. In addition, as shown, each of the side walls (1470)-(1484) is shown with a plurality of fenestrations (1432) positioned across the respective side wall area. In one embodiment, a different arrangement of fenestrations (1432) may be provided across one or more of the side walls (1470)-(1484). The fenestrations (1432) shown herein have an arcuate or circular shape, although in one embodiment, the size and shape of the fenestrations may be different, including but not limited to four sided, elliptical, star-shaped, louvers, etc.

A series of extensions (1460)-(1466) are provided on select sides of the octagon, and as shown herein, on alternating sides of the octagon. Each extension is positioned perpendicular to the respective side wall and parallel to the surface (1430). The extensions are sized and configured to be attached to a proximally positioned plenum. Details of the attachment are shown and described in FIG. 15. A plurality of secondary apertures are provided to support and enable the attachment of the housing (1420) to the plenum (not shown). $Extension_0$ (1460) is positioned proximal to $wall_0$ (1470) and shown with secondary apertures (1460a) and (1460b), $extension_1$ (1462) is positioned proximal to $wall_2$ (1474) and shown with secondary apertures (1462a) and (1462b), $extension_2$ (1464) is positioned proximal to $wall_4$ (1478) and shown with secondary apertures (1464a) and (1464b), and $extension_3$ (1466) is positioned proximal to $wall_6$ (1482) and shown with secondary apertures (1466a) and (1466b). Although two apertures are shown with each extension, this quantity should not be considered limiting. In one embodiment, a single secondary aperture may be provided with each extension, or an additional quantity of secondary apertures may be provided with each extension. In another embodiment, the extensions may not include any secondary apertures, and an alternative attachment mechanism may be provided to attach the housing to the plenum. Similarly, in one embodiment, the alternative mechanism may be utility together with a mechanical attachment mechanism received by one or more of the secondary apertures. Accordingly, the extensions (1460)-(1466) are configured to attach and/or secure the housing to the plenum.

Figure 15:
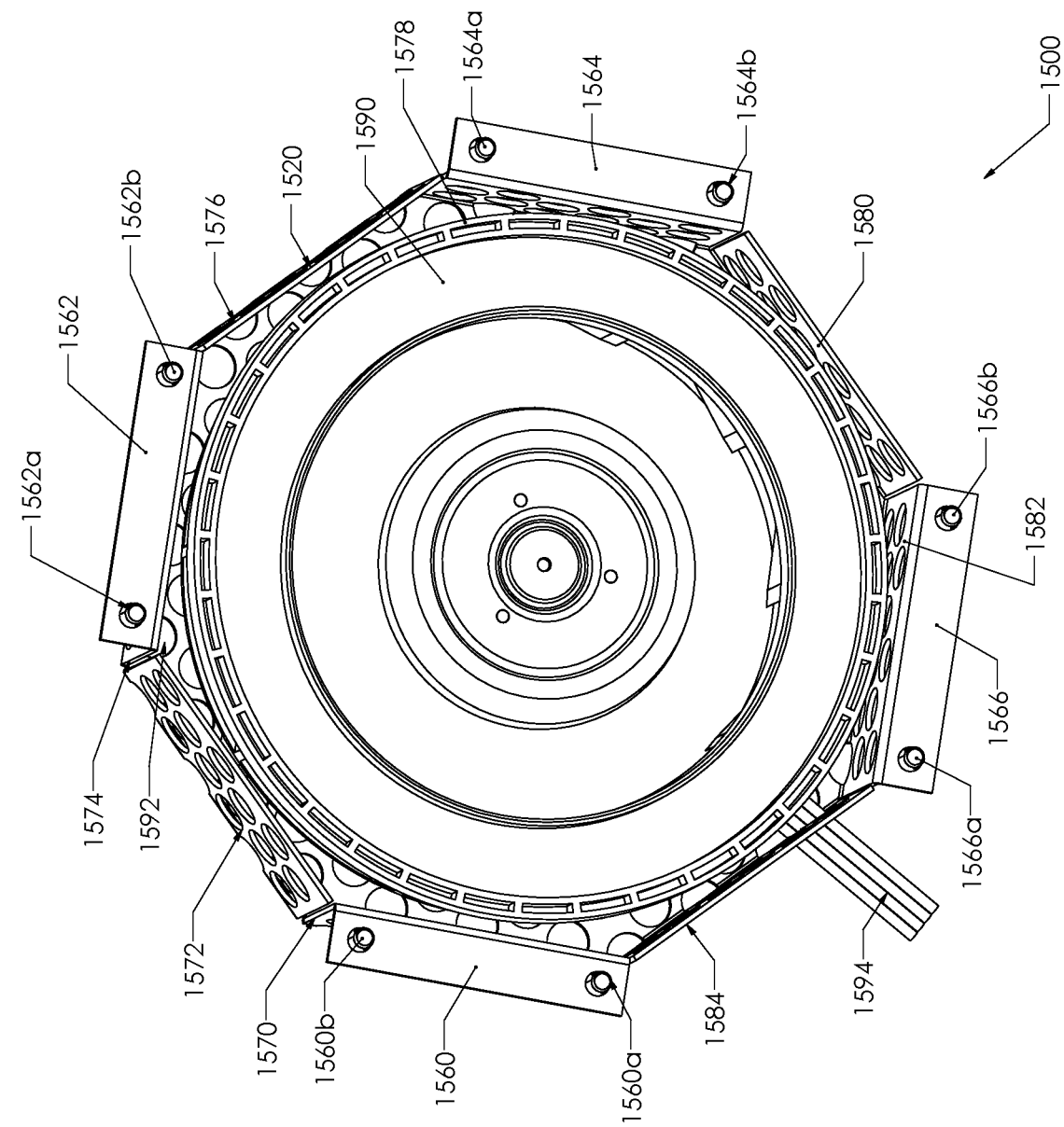
FIG. 15 depicts a bottom perspective view of the housing shown in FIG. 14 or 16 and a proximally positioned impeller fan.

Referring to FIG. 15, a bottom perspective view (1500) is provided of the housing and a proximally positioned fluid mover. As shown, the housing (1520) has a similar shape and configuration as the housing shown and described in FIG. 4, e.g. octagon. The fluid mover (1590) is shown positioned within an interior area (1592) formed by the fenestrated side walls (1570)-(1584). The fluid mover (1590) is shown herein with a wire(s) (1594) to deliver electricity to enable and facilitate rotation of the fluid mover (1590). In one embodiment, the wire(s) (1594) extends through one of the fenestrations in one of the side walls. As further shown in this view, alternating side walls are provided with a corresponding extension to secure the housing to the plenum (not shown). $Extension_0$ (1560) is positioned proximal to $wall_0$ (1570) and shown with secondary apertures (1560a) and (1560b), $extension_1$ (1562) is positioned proximal to $wall_2$ (1574) and shown with secondary apertures (1562a) and (1562b), $extension_2$ (1564) is positioned proximal to $wall_4$ (1578) and shown with secondary apertures (1564a) and (1564b), and $extension_3$ (1566) is positioned proximal to $wall_6$ (1582) and shown with secondary apertures (1566a) and (1566b). Accordingly, the walls of the housing (1520) form a cavity to receive the fluid mover (1590).

Figure 16:
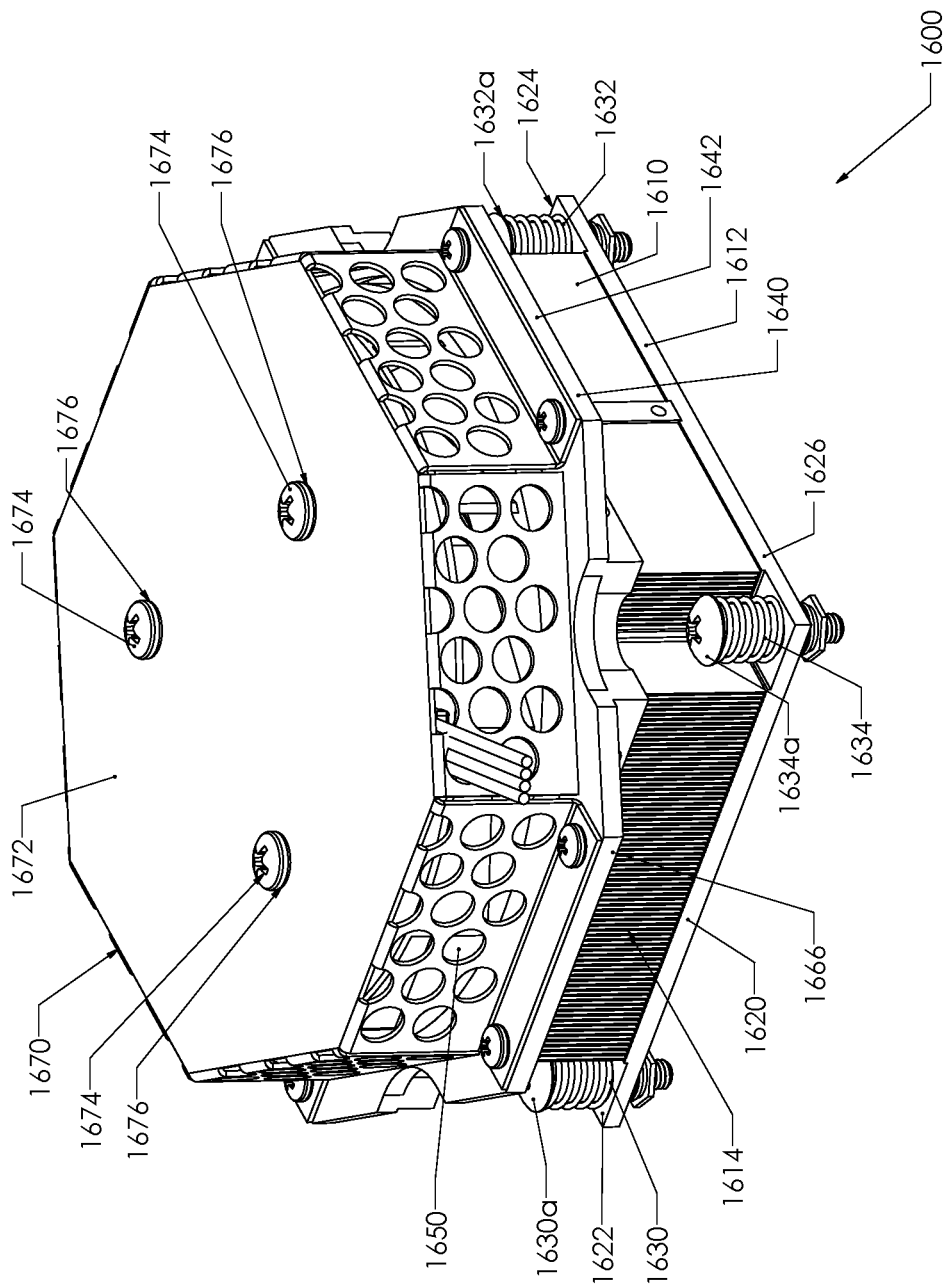
FIG. 16 depicts a perspective view of a heat exchanger housing assembly.

Referring to FIG. 16, a perspective view (1600) of a heat exchanger housing assembly is provided. As shown, a heat exchanger (1610) is provided with a fin field (1614) operatively coupled to a base (1612). The base (1612) is shown herein as a quadrilateral, e.g. 4-sided, with a heat exchanger aperture provided at the intersection of each adjacent side of the base. Three apertures are shown herein as (1630), (1632), and (1634). The fourth aperture is not visible in this view. $Aperture_0$ (1630) is positioned between $side_0$ (1620) and $side_1$ (1622), $aperture_1$ is not visible in this view, $aperture_2$ (1632) is positioned between $side_2$ (1624) and $side_3$ (1626), and $aperture_3$ (1634) is positioned between $side_0$ (1620) and $side_3$ (1626). Each of the apertures (1630)-(1634) is shown in receipt of a corresponding attachment mechanism. Specifically, $aperture_0$ (1630) is shown with attachment mechanism (1630a), $aperture_2$ (1632) is shown with attachment mechanism (1632a), and $aperture_3$ (1634) is shown with attachment mechanism (1634a). Each of the attachment mechanisms (1630a), (1632a), and (1634a) is provided to attach and/or secured the heat exchanger (1610) to a secondary surface (not shown).

The plenum (1640) is shown herein attached or otherwise secured to the heat exchanger (1610). As shown, the plenum (1640) extends over the fin field (1614) and has a first wall (1642) that extends the length of the fins and is positioned parallel to the fin field (1614). A similar plenum wall (not shown) is positioned on the opposite side of the plenum (1640) and also extends the length of the fins and is positioned parallel to the fin field (1614). The plenum wall (1642) has an aperture in receipt of an attachment mechanism to attach and/or secure the plenum to the heat exchanger (1610). The plenum is also provided with a second wall (1666) positioned perpendicular to the first wall (1642) that extends a partial length of the fins and is positioned perpendicular to the fin field (1614). As shown and described in FIG. 1, the second wall (1666) is also referred to as the lip. Accordingly, as shown herein, the plenum (1640) is configured to at least partially enclose the heat exchanger (1610) while enabling fluid flow across the fin field and providing ingress or egress for the fluid flow.

As shown and described, the plenum (1640) is configured with a primary aperture (not shown) to receive the fluid mover (1650). The housing (1670) is shown herein to envelop the fluid mover (1650). The housing (1670) is similarly configured to the housing shown and described in FIG. 14, including extensions and corresponding apertures to align with the plenum and to receive corresponding attachment mechanisms. The housing (1670) is shown with a selection and arrangement of fenestrations. The top surface (1672) of the housing (1670) is planar or relatively planar, and is shown herein without fenestrations. This is merely an embodiment of the selection and arrangement of housing fenestrations and should not be considered limiting. As further shown, the top surface (1672) is provided with a plurality of apertures (1674) and corresponding attachment mechanisms (1676) to secure the fluid mover (1650) to the housing (1670). Although three apertures (1674) are shown, the quantity should not be considered limiting. Similarly, although a mechanical attachment mechanism (1676) is shown in the form of a screw, it is understood that in one embodiment an alternative attachment mechanism may be provided and as such, the mechanism (1676) shown herein should not be considered limiting. Accordingly, the assembly (1600) shown herein illustrates an embodiment, with the profile of the fluid mover (1650) being larger than the perimeter of the heat exchanger (1610).

Figure 17:
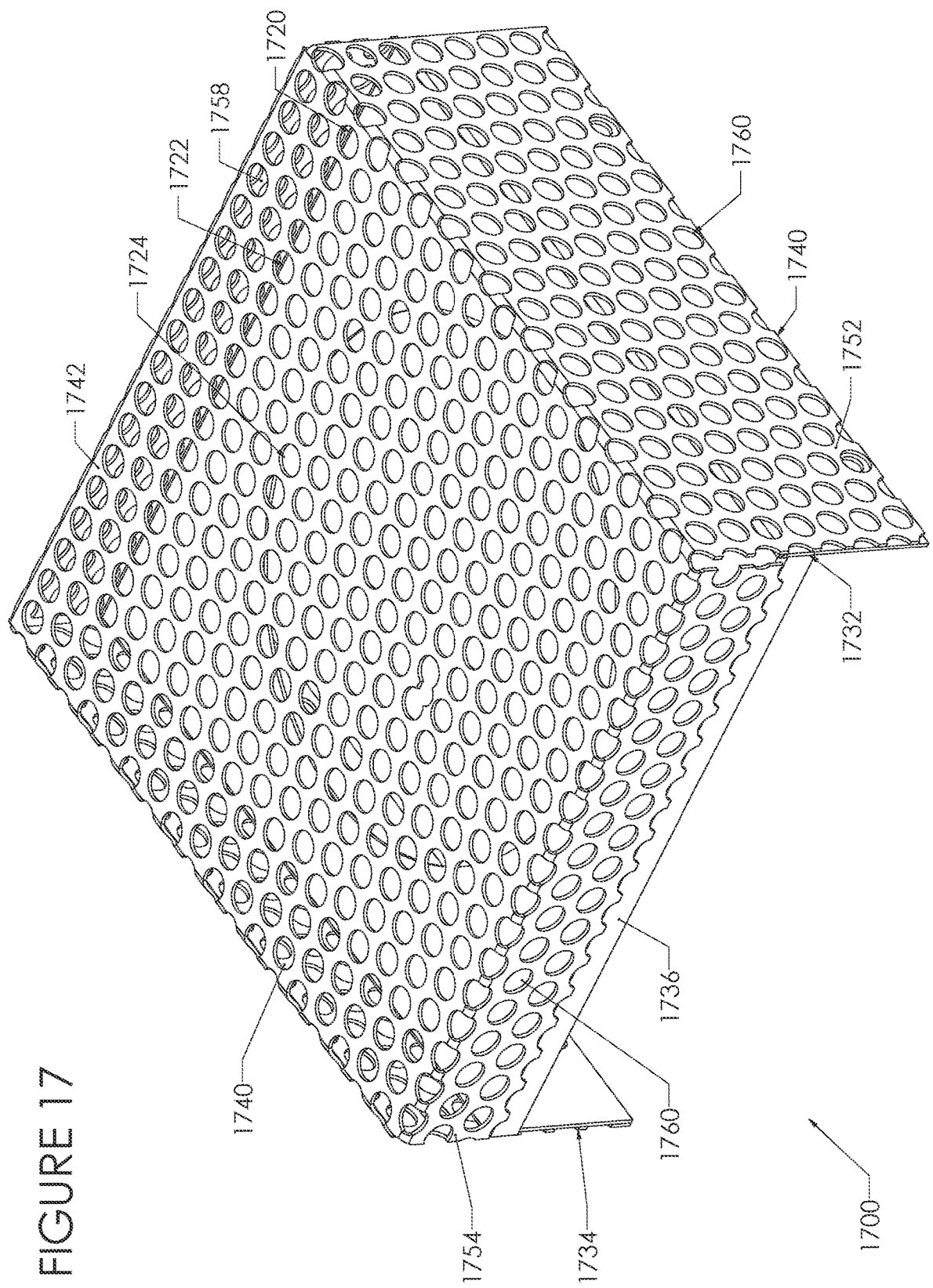
FIG. 17 depicts a perspective view of a fenestrated housing and a proximally positioned plenum.

Referring to FIG. 17, a perspective view (1700) of an assembly of the fenestrated housing and a proximally positioned plenum is shown. As shown, the plenum (1720) has a planar surface (1722) with a centrally positioned primary aperture (1724). A plurality of walls is provided as part of the plenum (1720) and in communication with the planar surface (1722). The walls include a first set of walls (1732) and (1734) have the same or similar length, and a second set of walls (1736) with the opposite wall not visible in this view. The second set of walls (1736) and the second not shown have a second length shorter than the length of the first set of walls (1372) and (1734). Details of the lengths of the walls are shown and described in detail in FIGS. 3 and 4. As further shown, the fenestrated housing (1740) is shown in communication with the plenum (1720). The housing (1740) includes a primary surface (1742) positioned parallel or relatively parallel to the surface (1722) of the plenum (1720). Similarly, a first set of walls (1752) and (1754) are positioned proximal and parallel or relatively parallel to walls (1732) and (1734). Walls (1752) and (1754) are shown with a plurality of fenestration (1760). A second set of walls (1756) and (1758) are positioned proximal and parallel or relatively parallel to wall (1736) and the oppositely positioned wall of the plenum (1720). The second set of walls (1756) and (1758) are sized relative to wall (1736), and are configured with a plurality of fenestration (1760).

The assembly shown and described in FIG. 17 is directed to the plenum (1720) and the proximally positioned fenestrated housing (1740). The secondary medium is not shown. It is understood that the secondary medium may be in the form of a heat exchanger or a printed circuit board, or any medium that may benefit from directional fluid flow. In the case of a printed circuit board, the first set of walls (1732) and (1734) of the plenum are attached or otherwise secured to the board. Similarly, in one embodiment, the assembly (1700) may be adapted for a computer chassis, with the chassis functioning as the plenum (1720) and the housing positioned proximal to the plenum.

Figure 18:
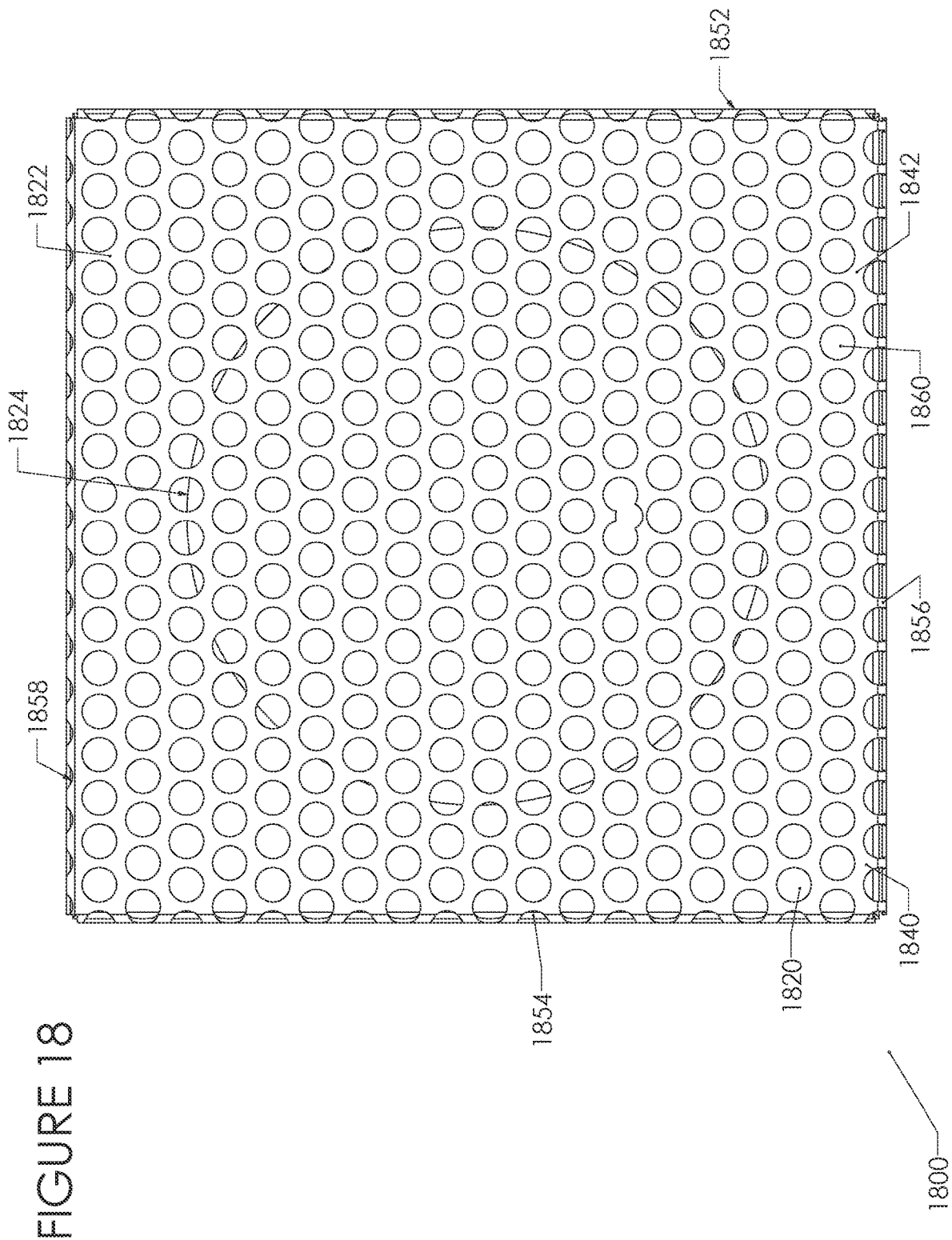
FIG. 18 depicts a top view of the fenestrated housing and proximally positioned plenum of FIG. 17.

Referring to FIG. 18, a top view (1800) of the fenestrated housing and proximally positioned plenum of FIG. 17 is shown. The plenum (1820) is shown enveloped by the housing (1840). The centrally positioned primary aperture (1824) is shown with the proximally positioned planar surface (1822). The housing (1840) is shown with fenestrations (1860) positioned across the primary surface (1842). In addition, the first set of parallel or relatively parallel walls (1852) and (1854) and the second set of parallel or relatively parallel walls (1856) and (1858) are shown.

Figure 19:
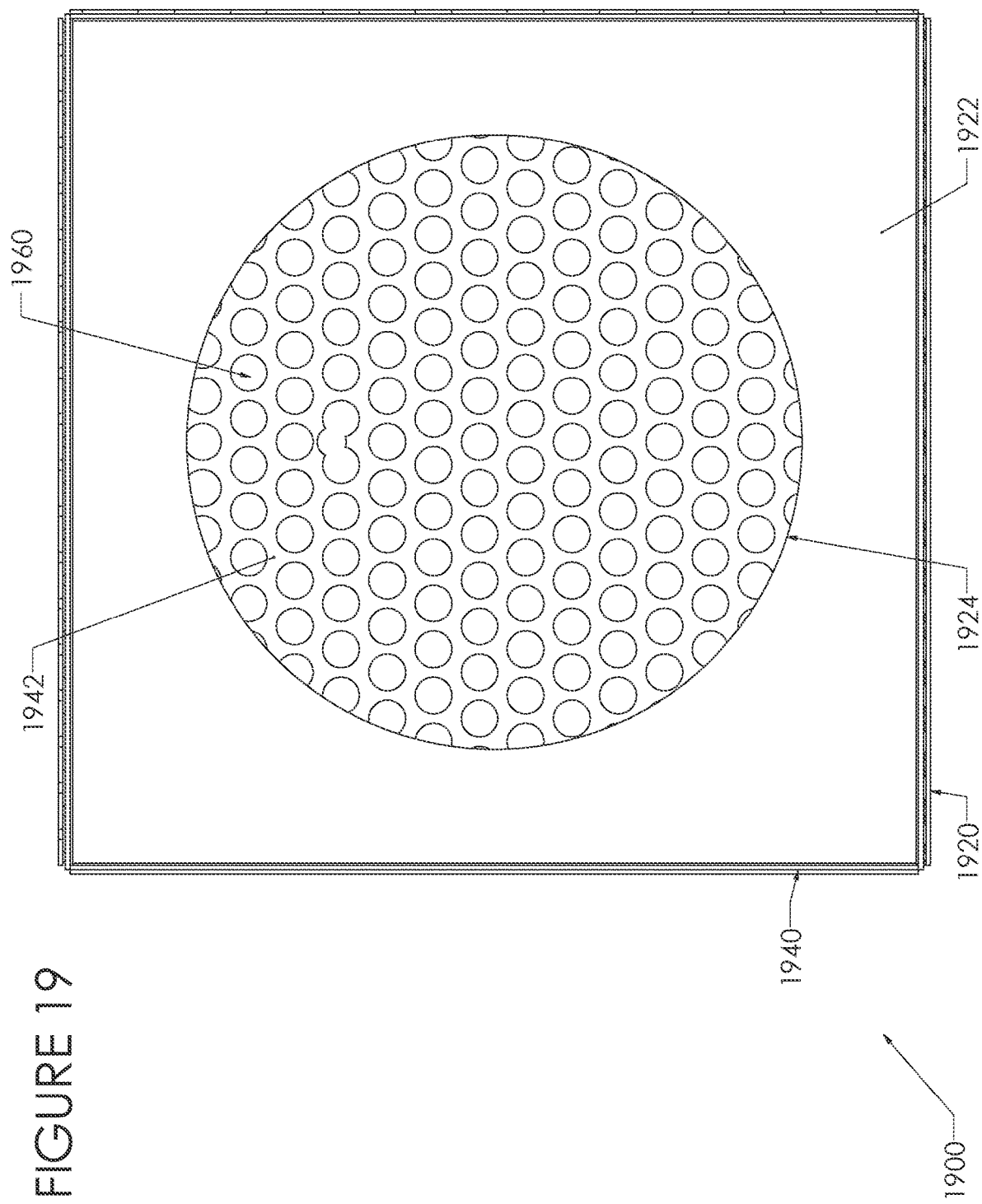
FIG. 19 depicts a bottom view of the fenestrated housing and proximally positioned plenum of FIG. 13.

Referring to FIG. 19, a bottom view (1900) of the fenestrated housing and proximally positioned plenum of FIG. 13 is shown. The plenum (1920) is shown with the centrally positioned primary aperture (1924). Due to the proximally positioned housing (1940), the fenestrations (1960) are shown in the primary surface (1942) positioned parallel or relatively parallel to the surface (1922) of the plenum (1920).

Referring to FIG. 20 is a front view (2000) of the fenestrated housing and proximally positioned plenum of FIG. 13 is shown, and referring to FIG. 21 a rear view (2100) of the fenestrated housing and proximally positioned plenum of FIG. 13 is shown. In view of the views (2000) and (2100). The plenum (2020) and (2120), respectively, is shown. The proximally positioned housing (2040) and (2140), respectively, are also shown, with the housing having fenestrations (2060) and (2160), respectively. As shown, the plenum (2020) and (2120), respectively, has oppositely positioned side walls (2022) and (2122), respectively, each positioned proximal to the sides walls (2042) and (2142), respectively, of the fenestrated housing (2040) and (2140), respectively. The front side walls (2024) and (2124) of the plenum (2020) and (2120), respectively, is shown with a proximally positioned front side wall (2044) and (2144) of the housing (2040) and (2140), respectively. The front side walls (2024) and (2124) are each orthogonal to the respective side walls (2022) and (2122). Accordingly, as shown, the front side walls (2044) and (2144) of the housing do not extend the entirety of the length of the respectively positioned side walls (2042) and (2142).

Figure 22:
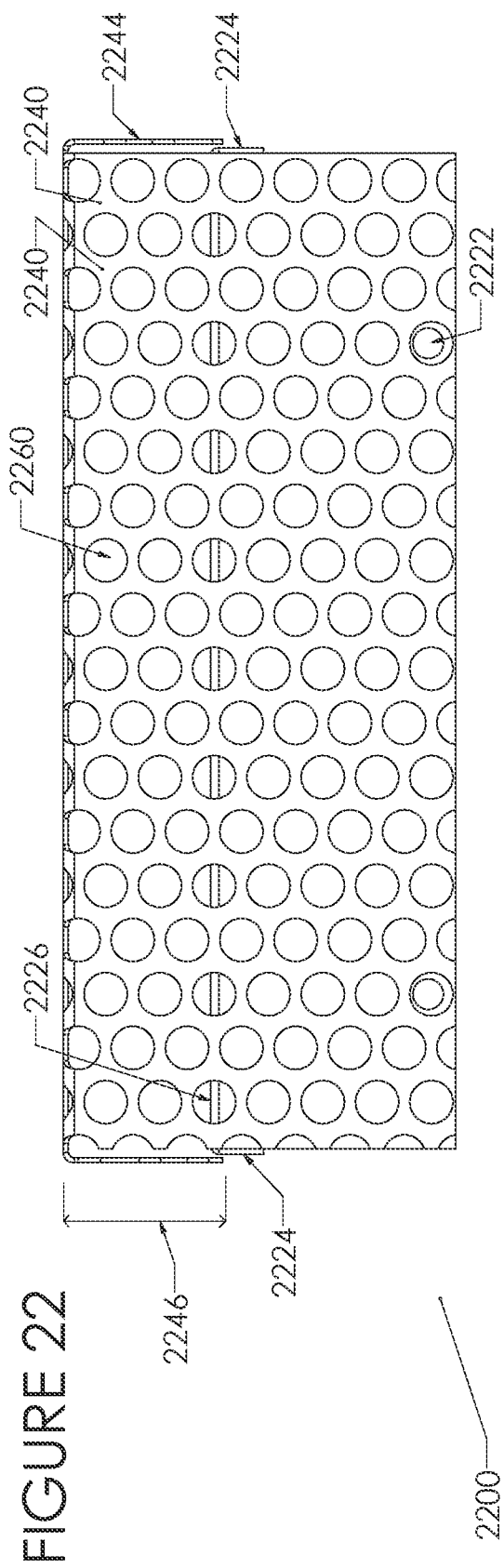
FIG. 22 depicts a left side view of the fenestrated housing and proximally positioned plenum of FIG. 13.
Figure 23:
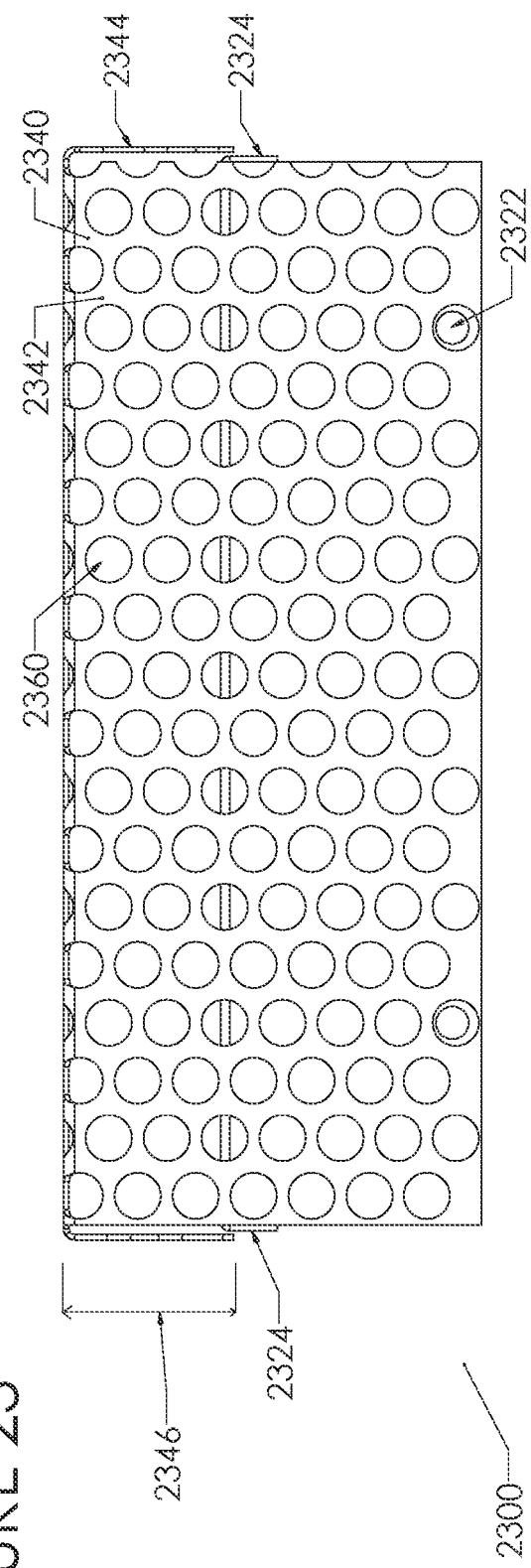
FIG. 23 depicts a right side view of the fenestrated housing and proximally positioned plenum of FIG. 13.

Referring to FIG. 22, a left side view (2200) of the fenestrated housing and proximally positioned plenum of FIG. 13 is shown, and referring to FIG. 23, a right side view (2300) of the fenestrated housing and proximally positioned plenum of FIG. 13 is shown. As shown in FIG. 22, the plenum (2220) is provided with a first set of walls (2222) and a second set of walls (2224). The oppositely positioned wall of (2222) is not visible in this view. The first set of walls (2222) has a first length, and the second set of walls (2224) has a second length, less than the first length. The housing (2240) is shown with fenestrations (2260) positioned across a first wall (2242), with the first wall positioned parallel or relatively parallel and proximal to the first wall (2222) of the plenum (2220). The housing (2240) is shown with a second set of walls (2244) positioned parallel or relatively parallel and proximal to the second set of walls (2224) of the plenum (2220). The first wall(s) (2242) has a length commensurate with the length of the first wall(s) (2222) of the plenum (2220), and the second set of walls (2244) has a length (2246) that extends to an area proximal to the primary surface (2226) of the plenum (2220). FIG. 23 has like parts to FIG. 22 designated by like numerals.

Figure 24:
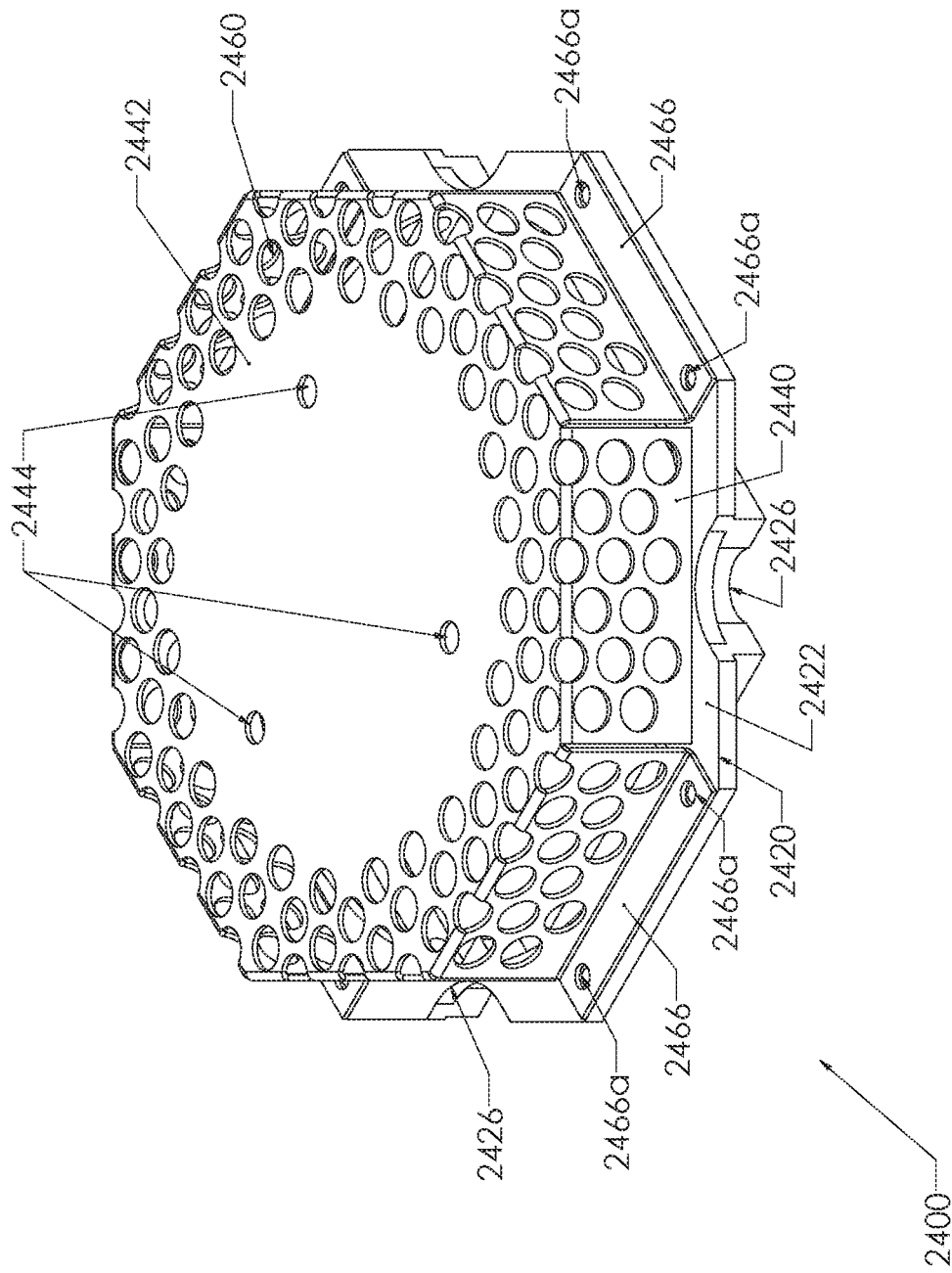
FIG. 24 depicts a front perspective view of the fenestrated housing of FIG. 14 with a proximally positioned plenum.

Referring to FIG. 24, a front perspective view (2400) of the fenestrated housing (1400) of FIG. 14 is shown with a proximally positioned plenum. As shown, the housing (2440) is positioned to cover or envelop the plenum (2420). The housing (2440) is provided with a primary surface (2442) that is planar or relatively planar. The primary surface (2442) is shown with fenestrations (2460) positioned across the primary surface (2442). A plurality of secondary apertures (2444) are shown positioned in the primary surface (2442) and are configured to receive an attachment mechanism (not shown) to secured the fluid mover (not shown) to the housing (2440). The plenum (2420) is shown with a surface (2422) parallel or relatively parallel to primary surface (2442). The housing (2440) has a secondary surface (2446) positioned proximal to the plenum surface (2422). As shown, apertures (2446a) are provided to receive an attachment mechanism to attached or secure the housing (2440) to the plenum (2420). The plenum surface (2422) is positioned parallel or relatively parallel to the secondary surface (2446) of the housing (2440). In addition, as further shown, the plenum (2420) includes openings (2426) so support receipt of an attachment mechanism (1634a) to secure a base of a proximally positioned heat exchanger (not shown) to a secondary surface (not shown). The openings (2426) are shown to have an arcuate shape, although this shape should not be considered limiting.

Figure 25:
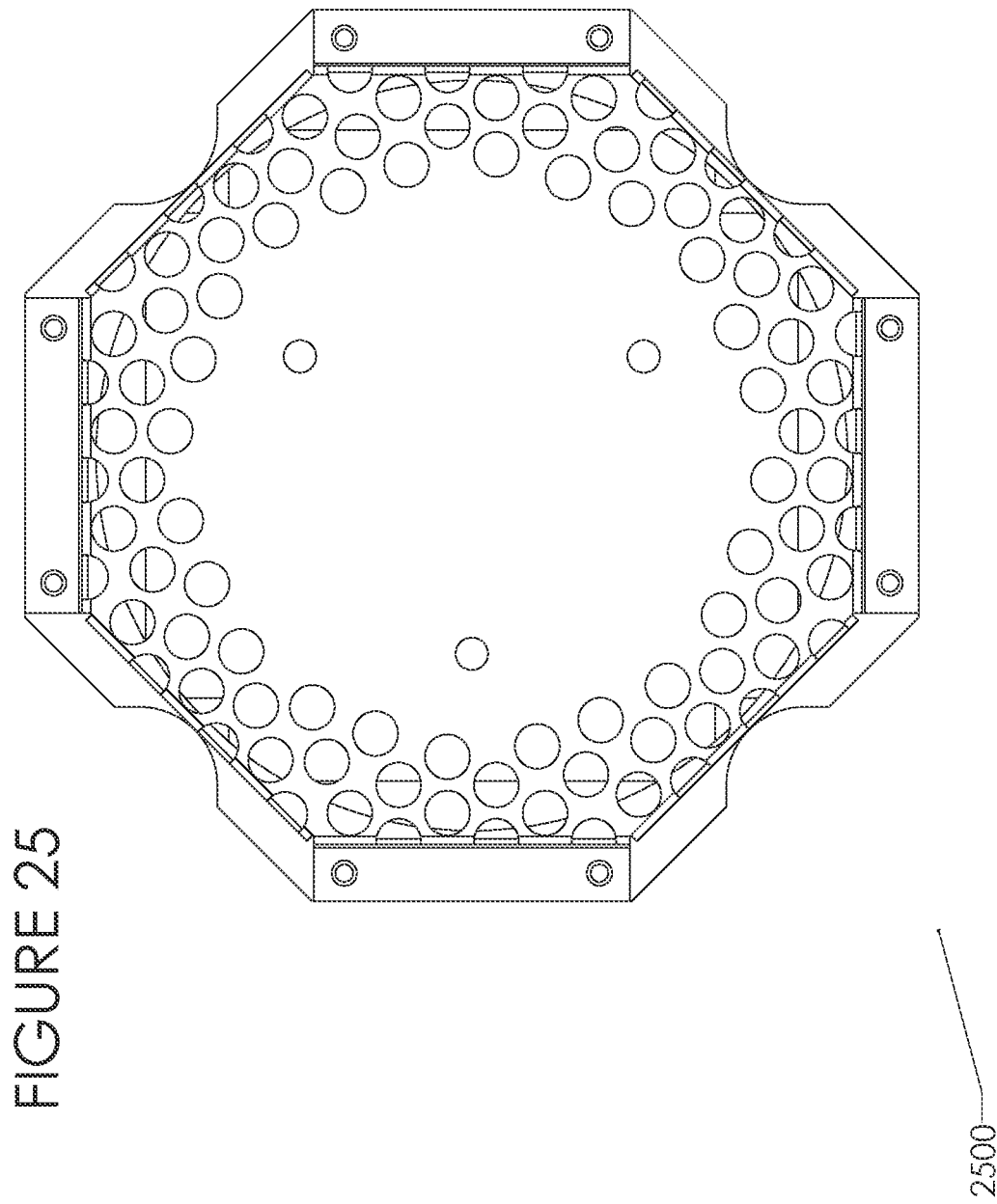
FIG. 25 depicts a top view of FIG. 24.
Figure 26:
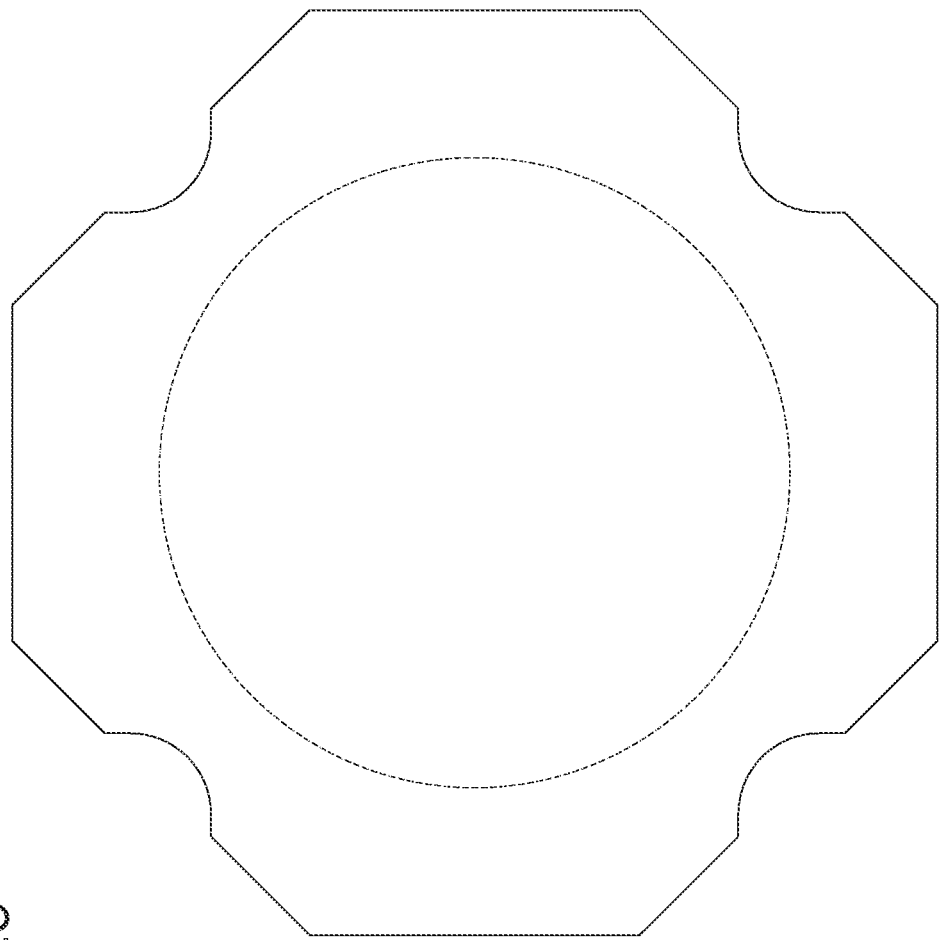
FIG. 26 depicts a bottom view of FIG. 24.
Figure 27:
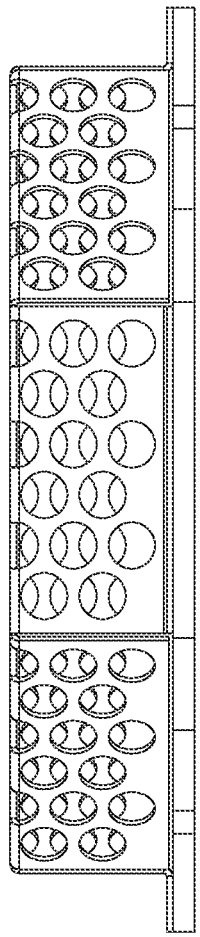
FIG. 27 depicts left side view of FIG. 24.
Figure 28:
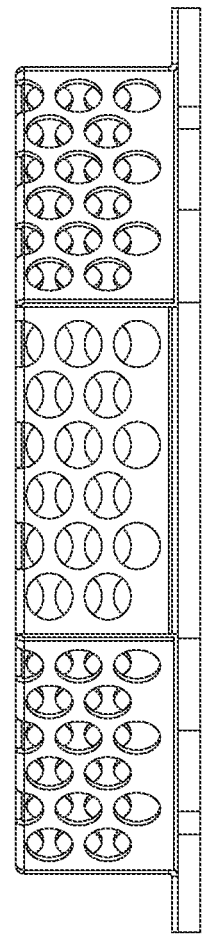
FIG. 28 depicts a right side view of FIG. 24.
Figure 29:
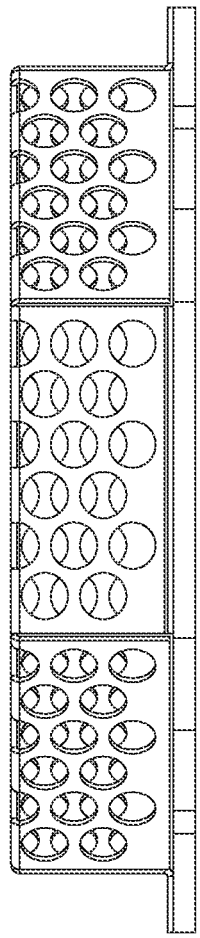
FIG. 29 depicts a front view of FIG. 24.
Figure 30:
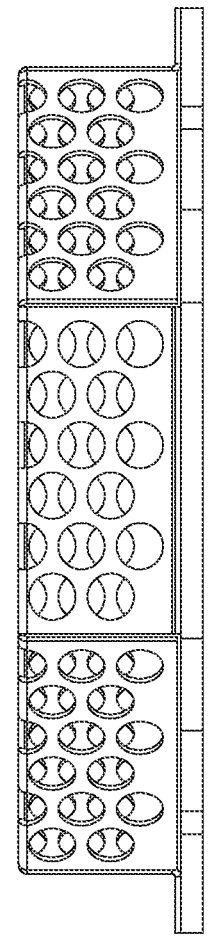
FIG. 30 depicts a rear view of FIG. 24.

Referring to FIG. 25, a top view (2500) of FIG. 24 is shown. Similarly, referring to FIG. 26, a bottom view (2600) of FIG. 24 is shown, referring to FIG. 27 a left side view (2700) of FIG. 24 is shown, referring to FIG. 28, a right side view (2800) of FIG. 24 is shown, referring to FIG. 29, a front view (2900) of FIG. 24 is shown, and referring to FIG. 30, and a rear view (3000) of FIG. 24 is shown.

Figure 31:
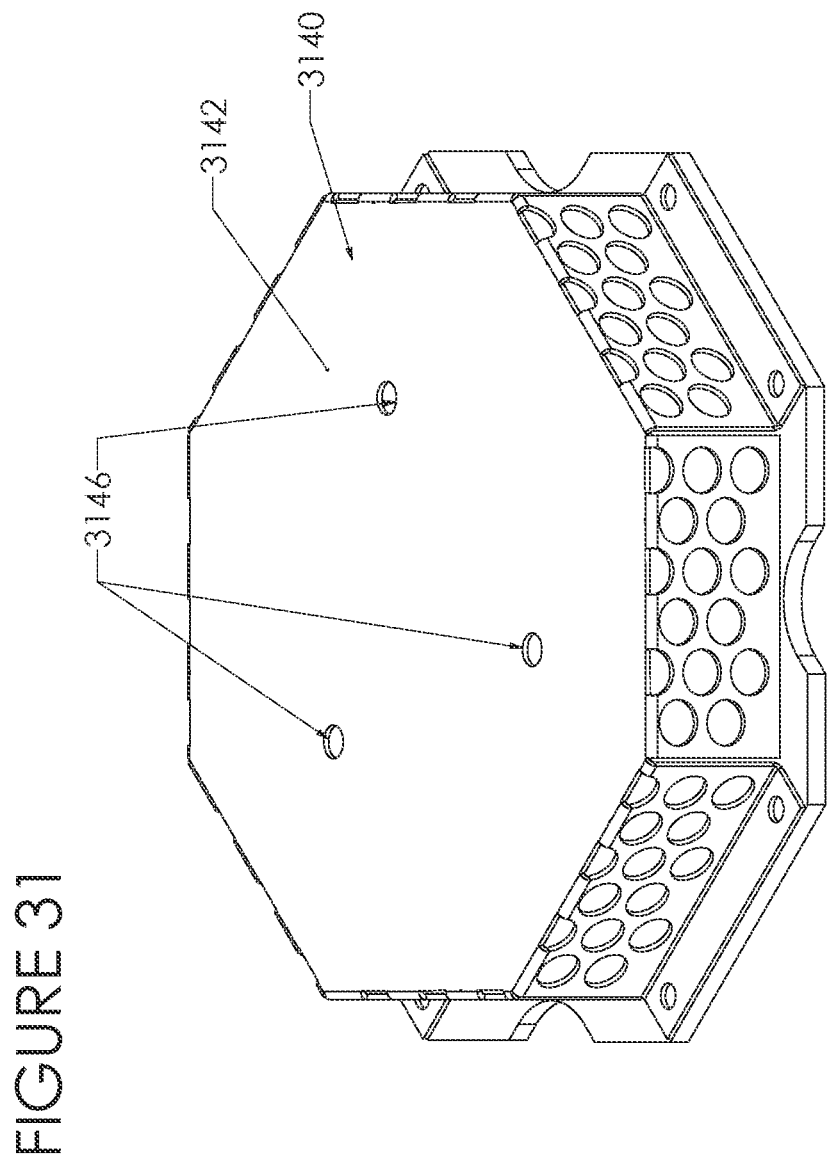
FIG. 31 depicts a front perspective view of the fenestrated housing of FIG. 16 with a proximally positioned plenum.

Referring to FIG. 31, a front perspective view (3100) of the fenestrated housing (1600) of FIG. 16 is shown with a proximally positioned plenum. This embodiment is similar to the assembly of FIG. 24 with the exception of the housing (3140) having a surface (3142) without fenestrations. A plurality of apertures (3146) are shown and are configured to receive an attachment mechanism (not shown) to secure a fan impeller (not shown) to the housing (3140).

Figure 32:
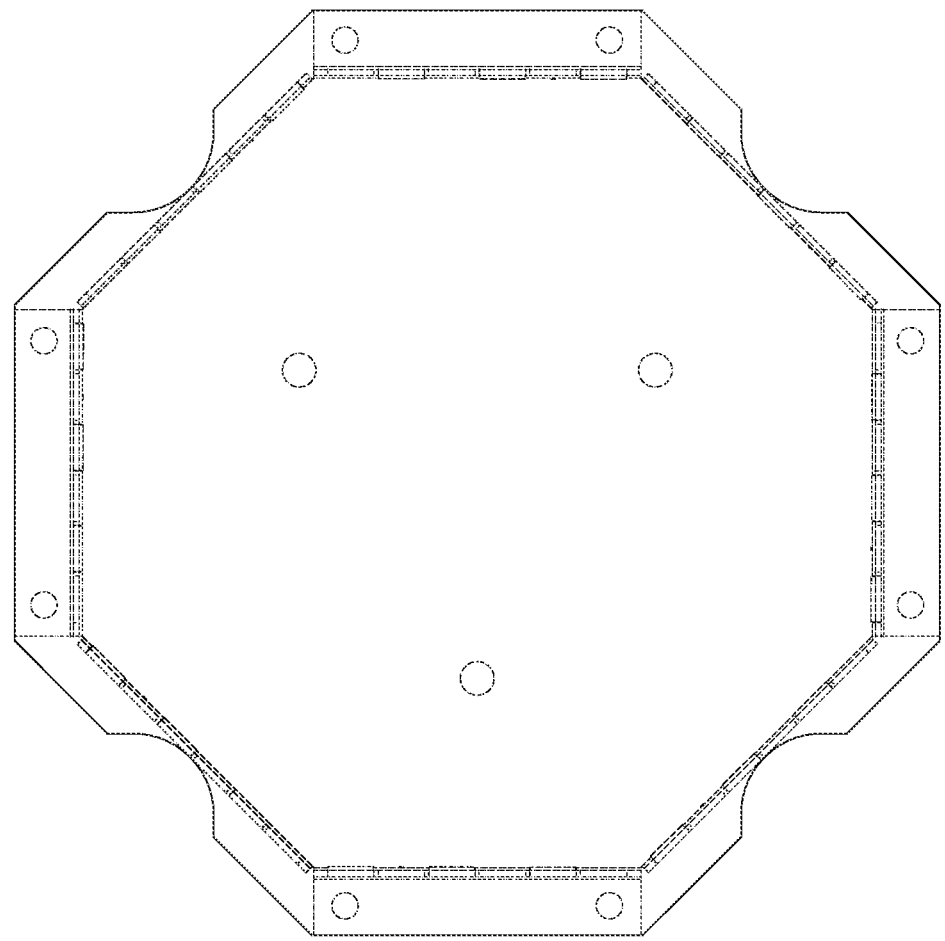
FIG. 32 depicts a top view of FIG. 31.
Figure 33:
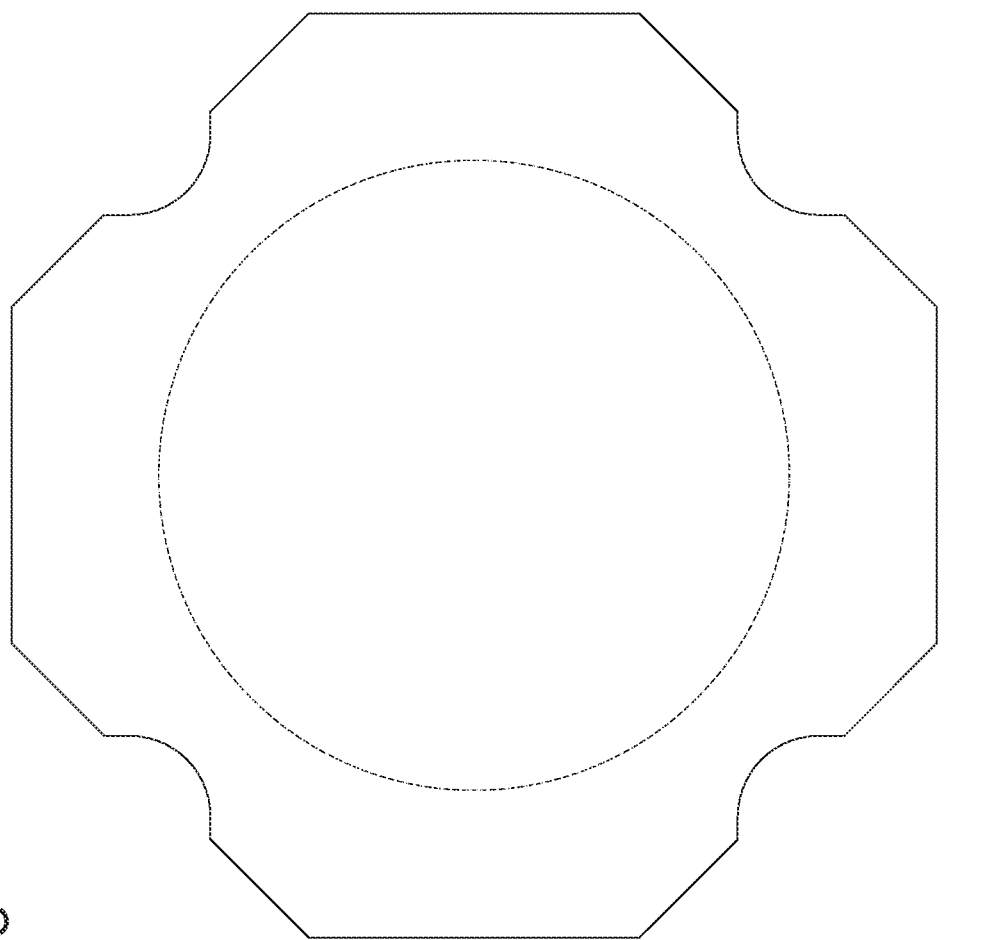
FIG. 33 depicts a bottom view of FIG. 31.
Figure 34:
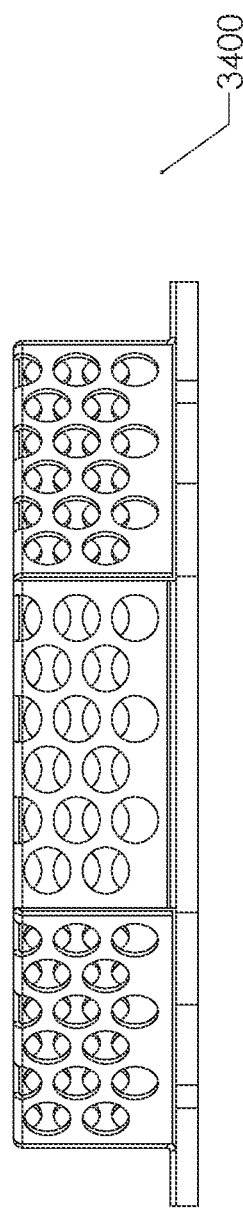
FIG. 34 depicts left side view of FIG. 31.
Figure 35:
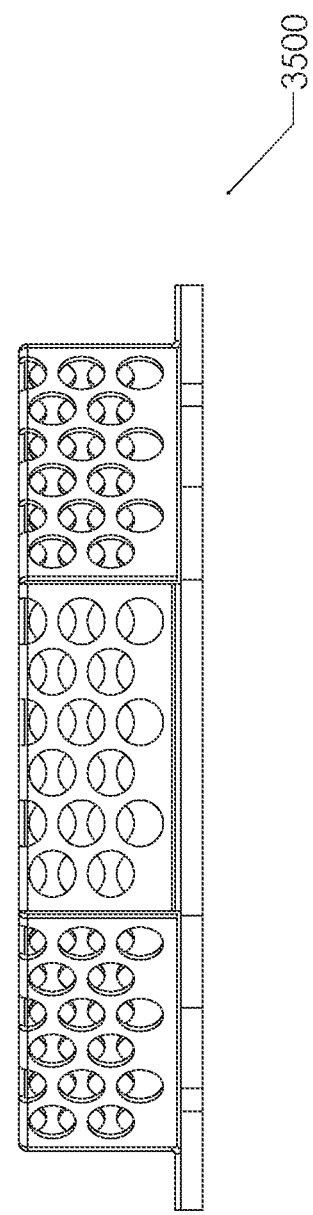
FIG. 35 depicts a right side view of FIG. 31.
Figure 36:
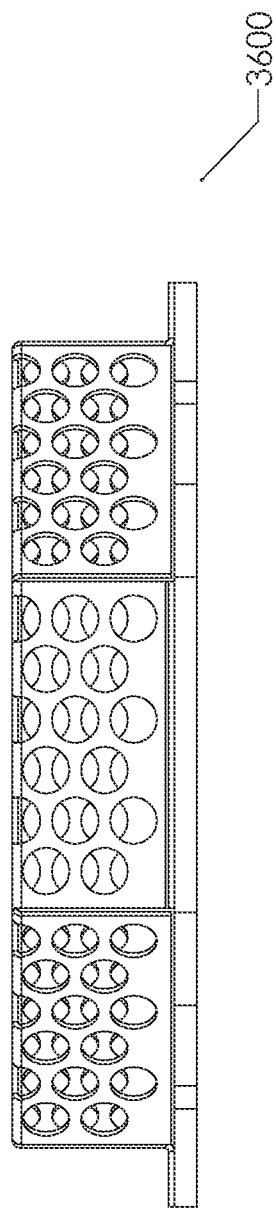
FIG. 36 depicts a front view of FIG. 31.
Figure 37:
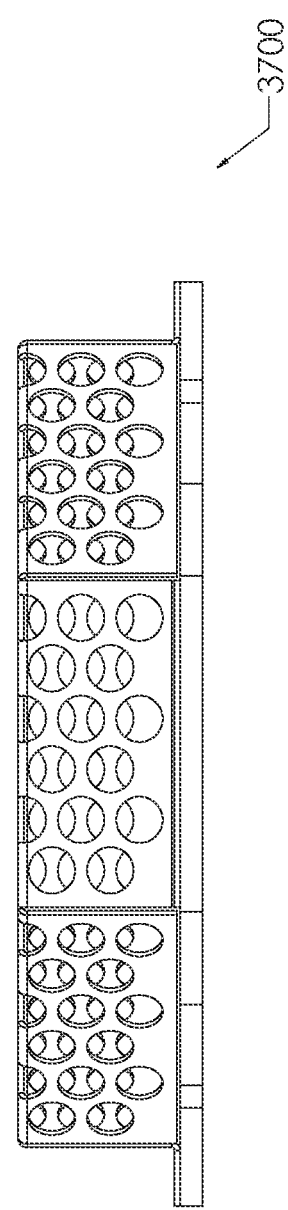
FIG. 37 depicts a rear view of FIG. 31.

Referring to FIG. 32, a top view (3200) of FIG. 31 is shown. Similarly, referring to FIG. 33, a bottom view (3300) of FIG. 31 is shown, referring to FIG. 34 a left side view (3400) of FIG. 31 is shown, referring to FIG. 35, a right side view (3500) of FIG. 31 is shown, referring to FIG. 36, a front view (3600) of FIG. 31 is shown, and referring to FIG. 37, a rear view (3700) of FIG. 31 is shown.

The configuration of the heat exchanger assembly with the fenestrated housing utilizes a motorized fluid mover to force fluid through the heat exchanger fins, e.g. fin field. Motorized fluid movers have a high volumetric flow rate and pressure. The fenestrated housing servers multiple purposes, as described above, including but not limited to attachment of the fluid mover to the fenestrated housing. Specifically, the fenestrated housing is configured with a surface to secure the housing structure of the fluid mover, while enabling the fan or corresponding blades within the housing structure to rotate and a corresponding motor to remain stationary. The fenestrations of the housing provide an ingress or egress venue for the fluid in multiple directions, while providing a limited barrier from the fluid mover.

The Figures provides herein illustrate the architecture, functionality, and operation of possible implementations of the heat exchanger assembly utilizing the combinations of various configurations of the heat exchanger, plenum, and fenestrated housing. The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed.

Many modifications and variations will be apparent to those of ordinary skill in the art without departing from the scope and spirit of the embodiments. The embodiments were chosen and described in order to best explain the principles and the practical application, and to enable others of ordinary skill in the art to understand the embodiments with various modifications as are suited to the particular use contemplated. Accordingly, the implementation pertains to a heat exchanger assembly with a fenestrated housing to optimize the cooling of heat sources in contact thereto.

It will be appreciated that, although specific embodiments have been described herein for purposes of illustration, various modifications may be made without departing from the spirit and scope of the embodiments. For example, the base of the heat exchanger in one or more embodiment may be configured with embedded one or more heat pipes or a vapor chamber to spread heat generated from a proximally positioned heat source. The shape and pattern of the heat pipes can have different patterns, including, but not limited to straight, radial, u-shaped, etc. The heat pipes can be round and embedded into the base or flat and soldered to the base of the heat exchanger. Similarly, the embodiments shown and described include one or more mechanical attachment mechanisms in the form of screws. It is understood that this attachment mechanism should not be considered limiting, and in one embodiment may be replaced or provided in combination with an alternative attachment mechanism, such as an adhesive, soldering, welding, etc. Similarly, although shown in the form of a heat exchanger, the secondary medium can be any heat producing medium that would benefit from fluid flow. The size and shape of the plenum should not be considered limiting, and in one embodiment is restricted by the size and shape of the secondary medium. Similarly, the size and shape of the housing, and the arrangement of the fenestrations, should not be considered limiting. Accordingly, the scope of protection of the embodiments is limited only by the following claims and their equivalents.

What is claimed is:

1. An apparatus comprising:
a secondary medium;
a fluid mover operable to create a fluid flow with respect to the secondary medium, the fluid mover comprising a housing structure and a fan housed within and rotatable relative to the housing structure;
a plenum directly attached to the secondary medium, the plenum including an aperture receiving the fluid mover, the plenum not directly physically contacting the fluid mover housing structure; and
a housing body directly attached to the fluid mover and positioned proximal to the secondary medium, the housing body having a plurality of fenestrations to support a multi-directional fluid flow associated with the fluid flow created by the fluid mover in operation, the housing body being a unitary item having a first surface and a plurality of second surfaces in communication with the first surface and extending substantially perpendicular to the first surface, and the housing body extending over and covering the plenum and the fluid mover, the plenum and the fluid mover provided inside the housing body.

2. The apparatus of claim 1, wherein the housing body comprises a periphery and a central portion relative to the periphery, and further comprising an attachment mechanism directly attaching the housing structure of the fluid mover to the central portion of the housing body.

3. The apparatus of claim 2, wherein the attachment mechanism directly attaches the fluid mover to the housing body in a suspended state.

4. The apparatus of claim 1, wherein the fenestrations are fluid egress ports to direct the created fluid flow away from the secondary medium.

5. The apparatus of claim 1, wherein the secondary medium is an element selected from the group consisting of: a heat exchanger, a printed circuit board, and a computer chassis.

6. The apparatus of claim 1, wherein the fenestrations have a shape selected from the group consisting of: arcuate, square, rectangular, hexagon, louvers, and combinations thereof.

7. The apparatus of claim 4, wherein the secondary medium is a heat exchanger having a fin field, and the plenum further comprises:
a first wall and a second wall positioned relatively perpendicular to the fin field, the fin field having a fin field height, the first and second walls having a first height extending over a portion of an entrance to the fin field to prevent premature fluid flow ingress into the fin field, wherein the first height is less than the fin field height.

8. The apparatus of claim 7, wherein the fluid mover is configured to create suction of the fluid flow and direct the fluid flow through the fin field.

9. The apparatus of claim 1, wherein the plenum aperture has a shape selected from the group consisting of: arcuate and four-sided.

10. The apparatus of claim 1, wherein the plenum aperture has a size larger than the fluid mover, and wherein the size prevents physical contact between the fluid mover and the plenum.

11. The apparatus of claim 1, further comprising one or more of the second surfaces of the housing body attached to a base of the secondary medium.

12. The apparatus of claim 7, further comprising a bar positioned within the fin field, the bar extending across oppositely positioned sides of the fin field, wherein the bar receives an attachment mechanism to secure the plenum to the heat exchanger.

13. A method for dissipating heat from a heat generating component, comprising:
providing an apparatus comprising:
a secondary medium;
a fluid mover operable to create a fluid flow with respect to the secondary medium, the fluid mover comprising a housing structure and a fan housed within and rotatable relative to the housing structure;
a plenum directly attached to the secondary medium, the plenum including an aperture receiving the fluid mover, the plenum not directly physically contacting the fluid mover housing structure; and
a housing body comprising a periphery and a central portion relative to the periphery, the central portion configured to receive an attachment mechanism to directly attach to the fluid mover housing structure and positioned proximal to the secondary medium, the housing body having a plurality of fenestrations to support a multi-directional fluid flow associated with the fluid flow created by the fluid mover in operation, the housing body being a unitary item having a first surface and at least two second surfaces, each of the at least two second surfaces in communication with the first surface and extending substantially perpendicular to the first surface, and the housing body extending over and covering the plenum and the fluid mover, the plenum and the fluid mover provided inside the housing body;
operating the fluid mover to create the multi-directional fluid flow through the fenestrations of the housing body and the fluid flow with respect to the secondary medium.

14. The method of claim 13, wherein the secondary medium is a heat exchanger having a fin field, wherein the plenum further comprises a first wall and a second wall, wherein the fin field has a fin field height, wherein the fenestrations comprise egress ports, and wherein the method further comprises:
positioning the plenum relative to the fin field, including positioning the first and second walls over a portion of an entrance to the fin field, the first and second wall positioning preventing premature fluid flow ingress through the fin field, wherein the first height is less than the fin field height.

15. The method of claim 14, further comprising the positioning of the fluid mover relative to the fin field to create suction of the fluid flow and direct the fluid flow through the fin field and out through the fenestrations as egress ports.

16. The method of claim 13, wherein the fenestrations of the housing body provide fluid egress ports for the receiving fluid flow with respect to the secondary medium.

17. The method of claim 13, wherein the fenestrations function as egress ports to direct fluid flow away from the secondary medium or ingress ports to direct fluid flow toward the secondary medium.

18. An at least partially unassembled apparatus comprising:
a secondary medium;
a fluid mover operable to create a fluid flow with respect to the secondary medium, the fluid mover comprising a housing structure and a fan housed within and rotatable relative to the housing structure;
a plenum configured to be directly attached to the secondary medium, the plenum including an aperture configured to receive and permit fluid moving operation of the fluid mover when the apparatus is assembled, the plenum being configured to not directly physically contact the fluid mover housing structure when the apparatus is assembled; and
a housing body comprising a periphery and a central portion relative to the periphery, the central portion configured to receive an attachment mechanism configured to be directly attached to the fluid mover housing structure and positioned proximal to the secondary medium, the housing body having a plurality of fenestrations to support a multi-directional fluid flow associated with the fluid flow created by the fluid mover in operation, the housing body being a unitary item having a first surface and two or more second surfaces, each of the two or more second surfaces configured to be in communication with the first surface and extend substantially perpendicular to the first surface, and the housing body configured to extend over and cover the plenum and the fluid mover, the plenum and the fluid mover configured to be provided inside the housing body.

19. The at least partially unassembled apparatus of claim 18, further comprising an attachment mechanism configured to directly attach the housing structure of the fluid mover to the housing body.

* * * * *